United States Patent [19]
Kurobe et al.

[11] Patent Number: 5,253,262
[45] Date of Patent: Oct. 12, 1993

[54] SEMICONDUCTOR LASER DEVICE WITH MULTI-DIRECTIONAL REFLECTOR ARRANGED THEREIN

[75] Inventors: Atsushi Kurobe; Tsutomu Tezuka, both of Yokohama; Tetsuo Sadamasa, Chigasaki; Mitsuhiro Kushibe, Tokyo; Yoshito Kawakyu, Kawasaki, all of Japan

[73] Assignee: Kabushiki Kaisha Toshiba, Kawasaki, Japan

[21] Appl. No.: 784,711

[22] Filed: Oct. 30, 1991

[30] Foreign Application Priority Data

Oct. 31, 1990 [JP] Japan ................................. 2-293914
Feb. 4, 1991 [JP] Japan ................................. 3-013552
Feb. 28, 1991 [JP] Japan ................................. 3-055448

[51] Int. Cl.$^5$ ................................................ H01S 3/19
[52] U.S. Cl. ........................................ 372/45; 372/92; 372/96
[58] Field of Search ........................ 372/45, 46, 96, 92

[56] References Cited

U.S. PATENT DOCUMENTS 5,052,016 9/1991 Mahbobzadeh et al. ............ 372/96

FOREIGN PATENT DOCUMENTS 2-26238  2/1990 Japan .
2125670  5/1990 Japan .

OTHER PUBLICATIONS

Applied Physics Letter 45 (4), Aug. 15, 1984, pp. 348-350, K. Iga, et al., "Room-Temperature Pulsed Oscillation of GaAlAs/GaAs Surface Emitting Injection Laser".
Japan Journal of Applied Physics, vol. 25, No. 6, Jun. 1986, pp. 924-925, K. Iga et al., "Room Temperature Pulsed Oscillation of GaAlAs/GaAs Surface Emitting Junction Laser Grown by MBE".
IEEE Journal of Quantum Electronics, vol. 24, No. 9, Sep. 1988, pp. 1845-1855, K. Iga et al., "Surface Emitting Semiconductor Lasers".
Yamamoto, Yoshihisa; "Controlled Spontaneous Emission in Semiconductor Lasers", (1989, Nov.) pp. 1-9: International Forum on the Frontier of Telecomm. Tech.
Yablonovitch, Eli; "Inhibited Spontaneous Emission in Solid-State Physics & Electronics", May 18, 1987; Physical Review Letters, vol. 58, No. 20, pp. 2059-2062.
Kleppner, Daniel; "Inhibited Spontaneous Emission", Jul. 27, 1981: Physical Review Letters, vol. 47, No. 4, pp. 233-236.
Fukui, Takashi et al.; "MOCVD Methods for Fabricating Quantum Wires and Quantum Boxes", Extended Abstracts of the 22nd (1990 International) Conference on Solid State Devices and Materials, Sendai, 1990, pp. 753-756 (no month listed).

Primary Examiner—James W. Davie
Attorney, Agent, or Firm—Oblon, Spivak, McClelland, Maier & Neustadt

[57] ABSTRACT

A microcavity semiconductor laser disclosed therein includes a double-heterostructure section including an intermediate active layer sandwiched between a first or lower cladding layer and a second or upper cladding layer above a semiconductive substrate. A first multi-layered reflector section is arranged between the substrate and the double-heterostructure section to have its reflectance which becomes maximum near the oscillation wavelength of the laser. The upper cladding layer is semi-spherically formed. A three-dimensional optical reflector covers the double-heterostructure section, for controlling spontaneous emission obtained in the double-heterostructure section along various directions, and for increasing the coupling ratio of spontaneous emission with a specific laser mode, thereby to decrease the threshold current.

5 Claims, 20 Drawing Sheets

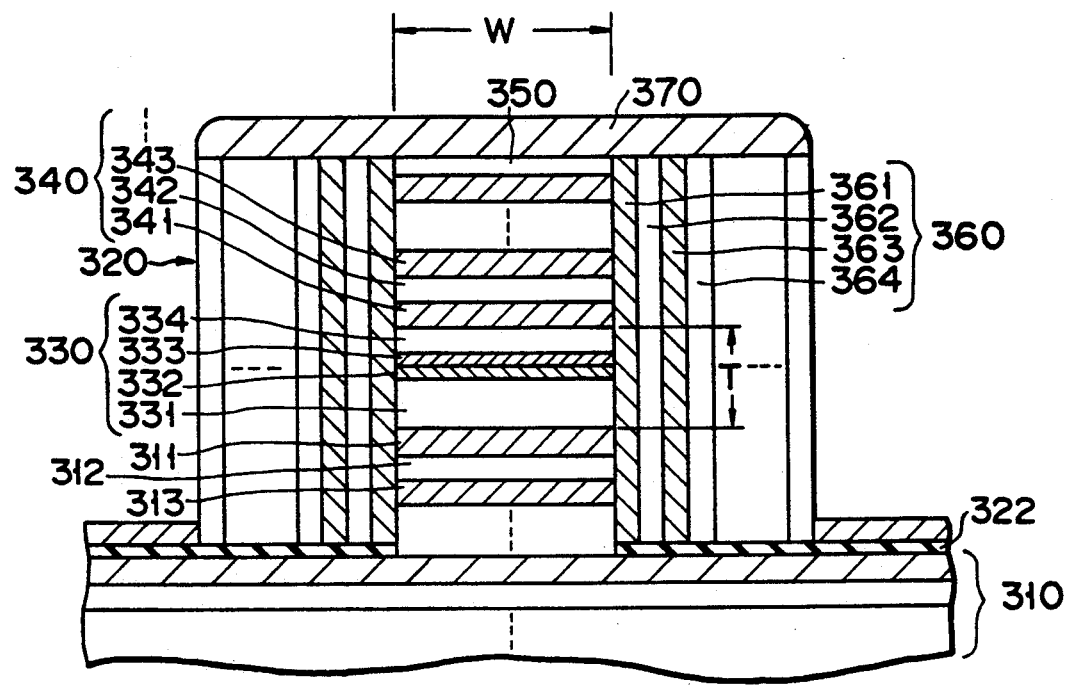
F I G. 19A
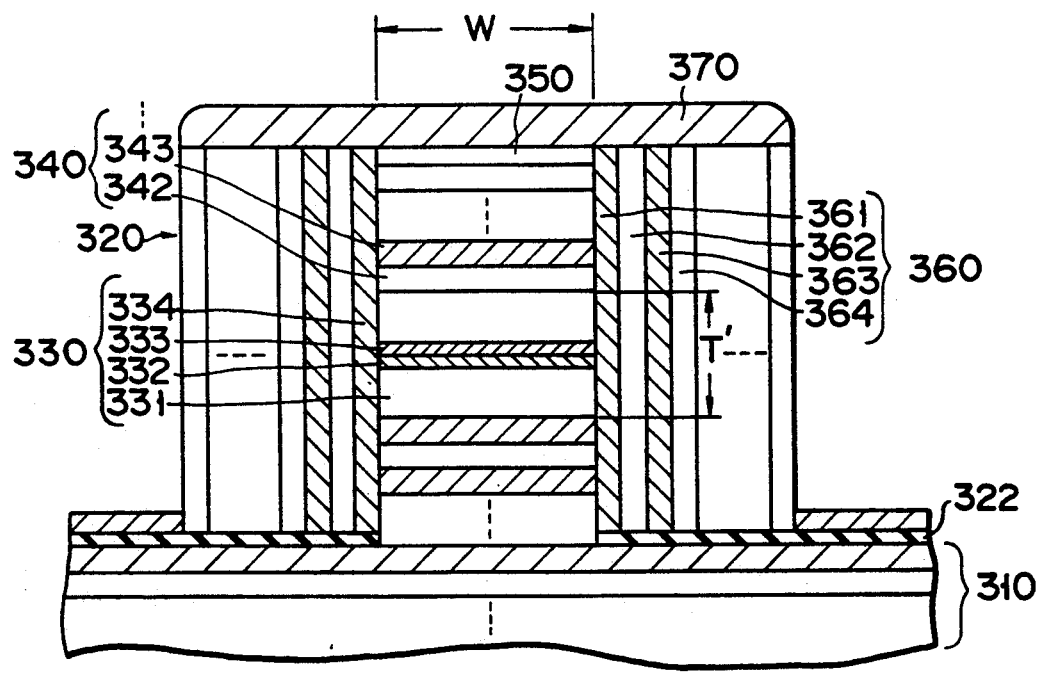
F I G. 19B

SEMICONDUCTOR LASER DEVICE WITH MULTI-DIRECTIONAL REFLECTOR ARRANGED THEREIN

BACKGROUND OF THE INVENTION

1. Field of the Invention

The present invention relates generally to solid-state light-emitting devices, and more particularly to microcavity semiconductor laser devices for use in an optical information processing system, an optical measurement system, or the like.

2. Description of the Related Art

Recently, solid-state light-emitting devices have been increasingly employed in the field of highly advanced digital computer technology such as an optical communication network, an optical information processing system, or the like. In the field of optoelectronics such as optoelectrical integrated circuit (IC) devices or photonic ICs, it has been studied by those skilled in the art to monolithically integrate semiconductor lasers on a one-chip substrate together with the other types of photosensing elements. Also, to achieve the parallel processing, it has been strongly demanded to integrate lasers in an arrayed fashion on a chip substrate.

A semiconductor laser using a microcavity is expected to be one of the solid-state light-emitting devices most preferably employed in the above applications due to excellent photoemission performance. In the laser of this type, the following two essential processes may exist to obtain output light: spontaneous emission and stimulated emission. The theoretical background thereof is described in, for example, A. Einstein, "Verhandlung der Deutsche Physicalische Gesellschaft," vol. 18, at p. 318 (1916).

In the systems discussed above, since further improvement in the package density of the, devices is strongly required, it becomes necessary to decrease the level of threshold current of each semiconductor laser as low as possible, thereby to improve high-integration fabrication on its monolithic substrate. Unfortunately, the proposed microcavity semiconductor lasers cannot satisfy such requirement of further improvement in the integration density. The reason for this is that the lasers are limited in the coupling ratio $\beta$ of spontaneous emission to the resonance mode of the microcavity. In other words, the use coefficient of spontaneous emission of the semiconductor lasers remain lower, causing the threshold current level to be higher.

SUMMARY OF THE INVENTION

It is therefore an object of the present invention to provide a new and improved solid-state light-emitting device which is low in the threshold current level.

In accordance with the above object, the present invention is drawn to a specific semiconductor light-emitting device which comprises a semiconductive substrate, and a double-heterostructure section including an intermediate active layer sandwiched between a first or lower cladding layer and a second or upper cladding layer above the substrate. A first multi-layered reflector section is arranged between the substrate and the double-heterostructure section to have a specific reflectance which is maximized near the oscillation wavelength of the laser device An optical reflector covers the double-heterostructure section, for controlling spontaneous emission obtained in the double-heterostructure section along a plurality of directions, and for increasing the coupling ratio of the spontaneous emission to the oscillation mode of the device.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIGS. 19A and 19B are the cross-sectional views of two different lamination structure in a ridge section of the laser shown in FIG. 18.

DETAILED DESCRIPTION OF THE PREFERRED EMBODIMENTS

Figure 1:
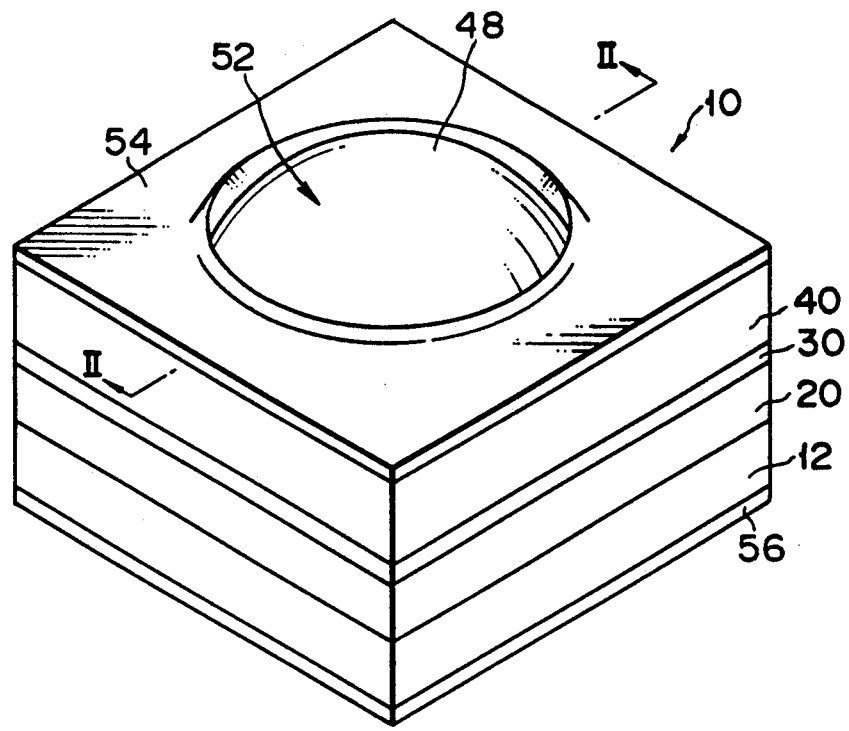
FIG. 1 is a diagram showing a perspective view of a semiconductor laser with a microcavity structure in accordance with one preferred embodiment of the invention.

Referring now to FIG. 1 a microcavity semiconductor laser device in accordance with one preferred embodiment of the present invention is generally designated by numeral "10." The term "microcavity" is based on the fact that the length L of this resonator is shorter enough to be on the order of the wavelength of oscillated light therein. Laser 10 includes a semiconductive substrate 12 of a certain conductivity type. Substrate 12 may be a gallium-arsenide layer doped with an n-type impurity, such as S, Te, or Si to a concentration of $2 \times 10^{18}$ atoms per cubic centimeter ($cm^{-3}$). A multi-layered structure 20 is arranged on substrate 12 to include a number of semiconductor layers 21 to 28, which may be fabricated using the known low-pressure metal-organic chemical vapor deposition (MOCVD) method.

Figure 2:
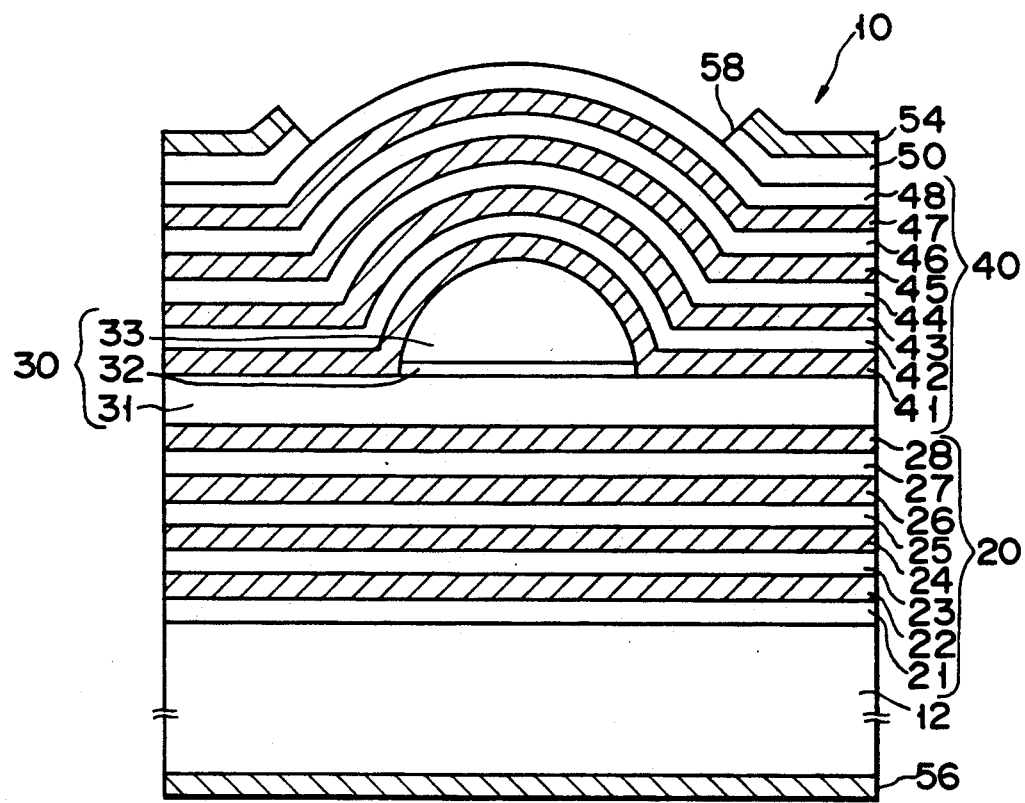
FIG. 2 shows a cross-sectional view of the laser of FIG. 1 along line II—II.

As seen from FIG. 2 the multi-layered section 20 consists of alternate lamination of two kinds of semiconductor layers: first layers 21, 23, 25, 27, and second layers 22, 24, 26, 28. First layers 21, 23, 25, 27 may be made from aluminum-gallium-arsenide material such as $Al_{0.3}Ga_{0.7}As$; second layers 22, 24, 26, 28 are from the same material of different composition ratio, such as $Al_{0.8}Ga_{0.2}As$. These layers 21-28 are doped with a p-type impurity to a concentration of $2 \times 10^{18} cm^{-3}$. Multi-layered structure 20 itself is similar to a corresponding section of the laser that has been proposed in "Cavity Quantum Electrodynamic & Quantum Computing" Y. Yamamoto, NTT basic research laboratories, Japan, 1st International Forum on the Frontier of telecommunications Technology, Session 3, 1989 at pp. 161-166.

Laser 10 further includes a double-heterostructure (DHS) section 30, which is arranged on multi-layered structure 20 and consists of three stacked layers 31, 32, 33. The intermediate layer 32 is an active layer made from indium-gallium-arsenide, which is sandwiched between the upper and lower layers 31, 33, which may be $Al_{0.3}Ga_{0.7}As$. Active layer 32 forces electrons and holes to be combined together to effect recombination. Layer 32 is formed to a selected thickness that is substantially equal to the "de Broglie" wave length, for example 7 nanometers. Section 30 has thus the "quantum well" structure.

The upper $Al_{0.3}Ga_{0.7}As$ layer 33 has a unique shape; it looks like a half-orb, and the cross-section thereof looks like the half-moon as illustrated in FIG. 2. Active layer 32 is a circular thin-film that is laid at the bottom of the semi-spherical layer 33.

Formed on the double-heterostructure (DHS) section 30 is another multi-layered structure 40, which consists of two kinds of semiconductor layers alternately laminated on each other: First layers 41, 43, 45, 47 are 46, 48 are from $Al_{0.8}Ga_{0.2}As$. All of layers 41-48 are doped with an n-type impurity to a concentration of $2 \times 10^{18} cm^{-3}$. Since these layers 41-48 are stacked on the semi-spherical layer 33 of DHS section 30, the second multi-layered structure 40 has a semi-spherically projected top surface that is similar to that of semispherical layer 33. Note that the illustration of FIG. 1 is deformed so as to emphasize the semi-spherical shape of section 30 (the uppermost layer 33) for the sake of clarity.

A p-type GaAs layer 50 is arranged on the top surface of layer 48 such that it slightly overlaps the "foothill" portion of a semi-spherical section 52 mounted on DHS section 30, as shown in FIG. 1. The concentration of doped carrier in layer 50 may be $5 \times 10^{18} cm^{-3}$. Layer 50 is covered by a metallic thin-film 54 serving as an electrode. Another electrode 56 is provided on the bottom surface of substrate 12 as shown in FIG. 2.

The first and second multi-layered sections 20 and 40 constitute the "distributed Bragg reflectors" respectively, by setting the thickness of each layer included therein (including the semi-spherical layers 41-48) to a specific value, which is essentially equal in optical distance to one-fourth of the luminescence peak wavelength $\lambda$ of the quantum well in vacuum, i.e., "$\lambda/4$." It should be noted that, in the rest of the description, the distance defined by the symbol "$\lambda$" means the optical distance, i.e., the measure of space that is obtained by multiplying the physical length by an effective (working) refractive index concerned. In general, the thickness of each layer in sections 20, 40 may be any multiplied value of $\lambda/4$ by a given integer: $\lambda/4$, $\lambda/2$, $3\lambda/4$, $\lambda$, and so forth.

More specifically, the InGaAs quantum-well active layer 32 is located above the uppermost layer 28 of first distributed Bragg reflector 20 at the distance of $\lambda/2$. The lowermost layer 41 of second distributed Bragg reflector 40 shapes semi-spherically in the middle area thereof. Circular active layer 31 is located in a plane containing the center of semi-sphere. The diameter of active layer 32 is $\lambda/2$; the radius thereof is equal to that of the overlying semi-spherical spacer layer 33. Layers of $\lambda/4$ thick are formed by crystal growth on DHS section 30 in this order. The upper electrode 54 has a circular opening 58 in the central area thereof. The edge of opening 58 overlaps the "foothill" of the exposed semi-spherical section 52 of second reflector 40.

The operation of the three-dimensional microcavity semiconductor laser 10 is as follows. When the current is given externally to the two opposite electrodes 54, 56, injected electrons and holes are radiatively recombined together at a certain wavelength which falls in the range of emission spectrum bandwidth. The multi-layered microcavity is a resonator of high reflectance. The optical resonance mode is defined in Bragg reflectors 20, 40. In this case, only a single mode can be allowed to exist in the spectrum. In other words, a mode exists which has a peak wavelength $\lambda_G$ (substantially equal to the oscillation peak wavelength in the free space) only at a specific wavelength. Spontaneous emission takes place at the wavelength $\lambda_G$. Theoretically, the optical phenomenon may follow the suggestion of "Inhibited Spontaneous Emission," by Daniel Kleppner, Physical Review Letter, 1981 at pp. 233–236. In the actual device, however, it cannot be expected that 100 percent of spontaneous emission is coupled successfully with the resonance mode; non-coupled components will externally escape out of the laser device.

The characteristic feature of the laser 10 is that the presence of semi-spherical distributed Bragg reflector 40 can resolve the above problem. The reason for this is that reflector 40 can execute reflecting function for every optical component that radiates in any direction, thereby to dramatically improve the coupling ratio $\beta$ of spontaneous emission with the oscillation resonance mode. With the "semi-spherical microcavity" arrangement, the threshold current of laser 10 can be decreased. The experimental results by the present inventors have demonstrated that the coupling ratio $\beta$ of laser 10 can increase up to 10 percent or more, and that the threshold current can be lowered correspondingly.

It is also the characteristic feature of laser 10 that the semi-spherical microcavity structure can be fabricated using one of the presently available manufacturing techniques with high productivity. This leads to the possibility of efficient manufacture of the semiconductor laser with the uniquely-shaped microcavity structure at the minimized risk and low cost.

Figure 3A:
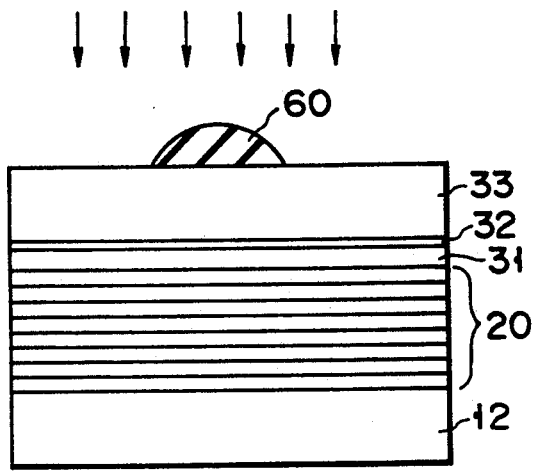
FIGS. 3A to 3C illustrate in schematic cross-section some of the major steps in the formation of the multi layered structure of the laser shown in FIGS. 1 and 2.

A typical manufacturing method of the laser 10 is as follows. In FIG. 3A there is shown a composite structure including the n-type GaAs substrate 12, the first multi-layered section 20, and the DHS section consisting of the upper and lower AlGaAs layers 31, 33 and an intermediate InGaAs layer 32 sandwiched therebetween. Multi-layered section 20 has been formed by alternately growing the first layers 21, 23, 25, 27 of $Al_{0.3}Ga_{0.7}As$, and the second layers 22, 24, 26, 28 of $Al_{0.8}Ga_{0.2}As$ using a known low-pressure MOCVD method. In DHS section, layers 31, 32, 33 have been formed using the well-known crystal growth technique, wherein layer 33 is greater in thickness than the underlying layer 31.

As shown in FIG. 3A, a bulged mask layer 60 is deposited on spacer layer 33. Mask layer 60 may be a silicon-oxide layer. This layer is then subjected to a shaping process, wherein a known electron-beam exposure technique and a conventional wet-etching method may be employed to cause layer 60 to have a half-orb like appearance, which has been previously described with reference to FIG. 2.

Figure 3B:
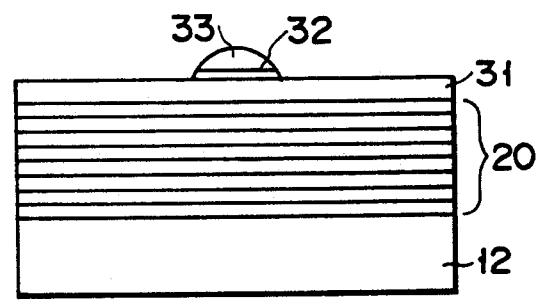

Subsequently, anisotropic dry etching process using chlorine plasma is performed with bulged layer 60 being as a mask. As a result, spacer layer 33 and the underlying active layer 32 are etched vertically to form a similar bulged, half-orb like section 32, 33, as shown in FIG. 3B. During this etching process, mask layer 60 is also etched more slowly than layers 33, 32 are etched. While "shrinking" of mask layer 60 due to such etching, layer 33 may be locally etched causing its central portion to remain with a processed surface being smoothened in accordance with the presently remaining thickness of mask layer 60. The underlying layer 31 is thus exposed at its processed top surface region, which is located around bulged sections 32, 33. Now, the semi-spherical DHS section 30 of FIG. 2 is obtained.

If required, proton particles may be injected by sputtering into the multi-layered structure of FIG. 3A before the anisotropic dry etching process is performed. The injection intensity is to be high enough for the injected protons to reach the underlying spacer layer 31. With such additional treatment, the proton-injected region may act as a high-resistance section, which will facilitate current to be injected into active layer 32 more effectively than otherwise.

Figure 3C:
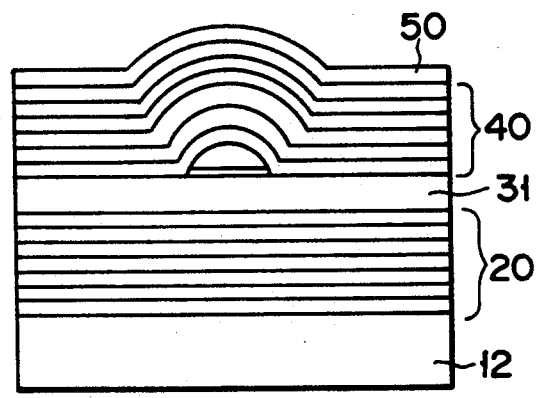

Then, as shown in FIG. 3C, layers 41–48 of FIG. 2 are sequentially deposited in this order. The resultant composite structure constitutes multi-layered Bragg reflector section 40 shown in FIG. 1 or 2, wherein the $Al_{0.3}Ga_{0.7}As$ layers 41, 43, 45, 47 and $Al_{0.8}Ga_{0.2}As$ layers 42, 44, 46, 48 are alternately stacked on one another. GaAs contact layer 50 is then formed uniformly on the uppermost layer 48. A well-known low-pressure MOCVD technique may be utilized to form the above structures 40, 50. Since thin-layers are sequentially laminated on the bulged layers 32, 33, the semi-spherical shape will be kept going on to the top surface of layer 50; the resultant bulged section in layer 50 resembles layer 33a in shape. After electrodes 54, 56 are deposited, layers 50, 54 are etched in part using a conventional photolithography and deposition technique to obtain the laser structure of FIG. 1 or 2.

It is noted in the embodiment laser 10 that the shape of quantum well active layer 32 and Bragg reflector 40 and the positional relationship therebetween may be modified when reduction to practice. As one example, a plurality of pairs of high-refractive-index layers and low-refractive-index layers each having the thickness of $\lambda/4$ may be added to Bragg reflector 40. The distance between active layer 32 and reflector 40 may be changed to be any multiplied value of $\lambda$ by a given integer. The spacer layers 31, 33 may be modified such that the forbidden band thereof get greater gradually in accordance with an increase in the distance from active layer 32, thereby to obtain the "GRIN-SCH" structure.

Figure 4:
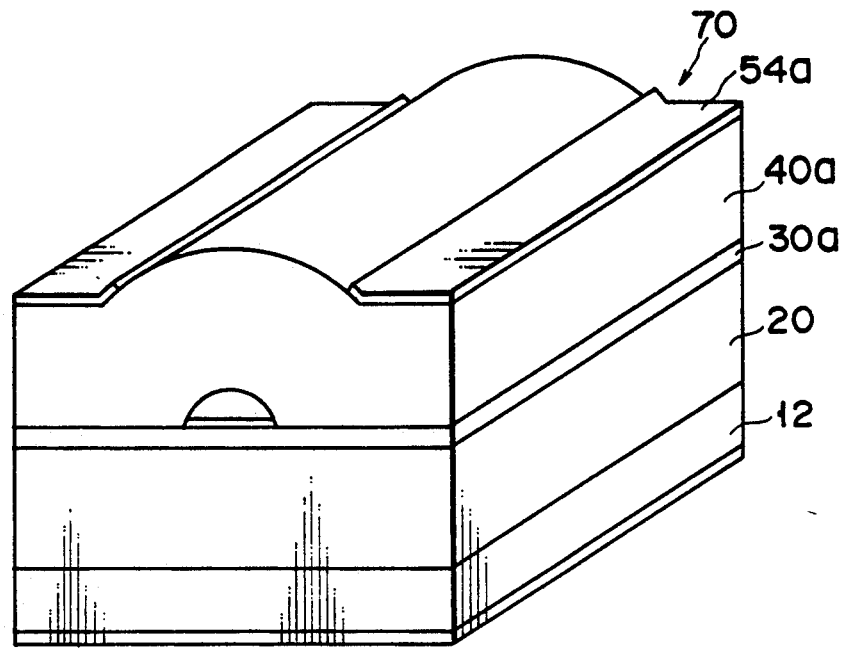
FIG. 4 is a diagram showing a perspective view of a semiconductor laser which is one possible modification of the laser shown in FIGS. 1 and 2.
Figure 5:
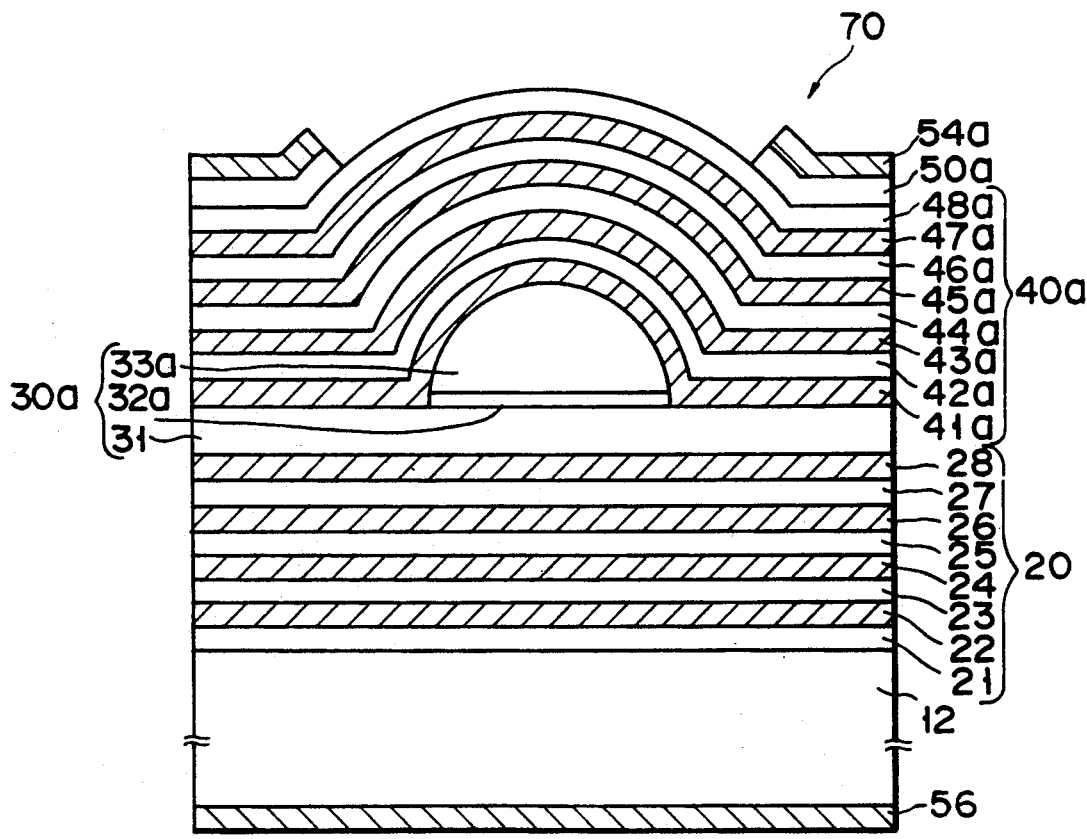
FIG. 5 shows a main cross-sectional view of the laser of FIG. 4.

One possible modification is shown in FIG. 4, wherein laser 70 is different from the embodiment shown in FIGS. 1 and 2 in that the quantum well active layer 32 and Bragg reflector 40 are arranged in a half-column shape, rather than in the semi-spherical shape as shown in FIG. 1. More specifically, as shown in FIG. 5, the upper, multi-layered Bragg reflector structure 40a has a similar cross-sectional structure to that shown in FIG. 2; its overall appearance looks like a half-column on the top surface thereof as illustrated in FIG. 4.

The upper spacer layer 33a of DHS section 30a has a half-columnar shape. Thin layers 41a, 42a, . . . , 48a are sequentially stacked on layer 33a so as to inherit the curved surface configuration. Active layer 32a is located in the plane containing the center of half-columnar cross-sectional shape, and is same in thickness as that in the embodiment of FIG. 2. Active layer 32a may be narrower in width to extend linearly along the longitudinal direction of device 70. With laser 70 of FIGS. 4 and 5 also, similar advantage can be attained as in the laser 10.

Figure 6:
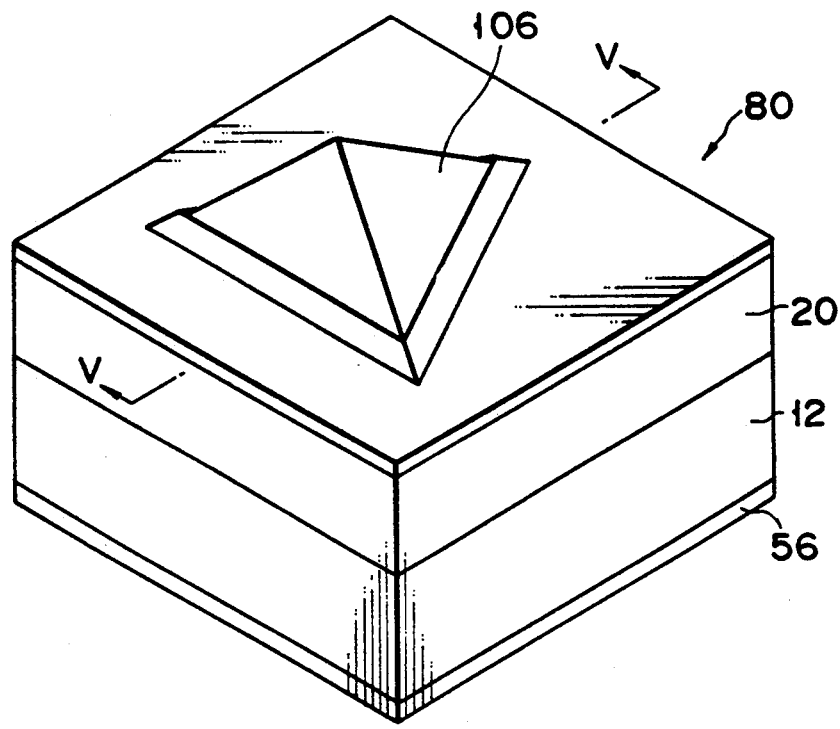
FIG. 6 is a diagram showing a perspective view of a semiconductor laser in accordance with another embodiment of the invention.
Figure 7:
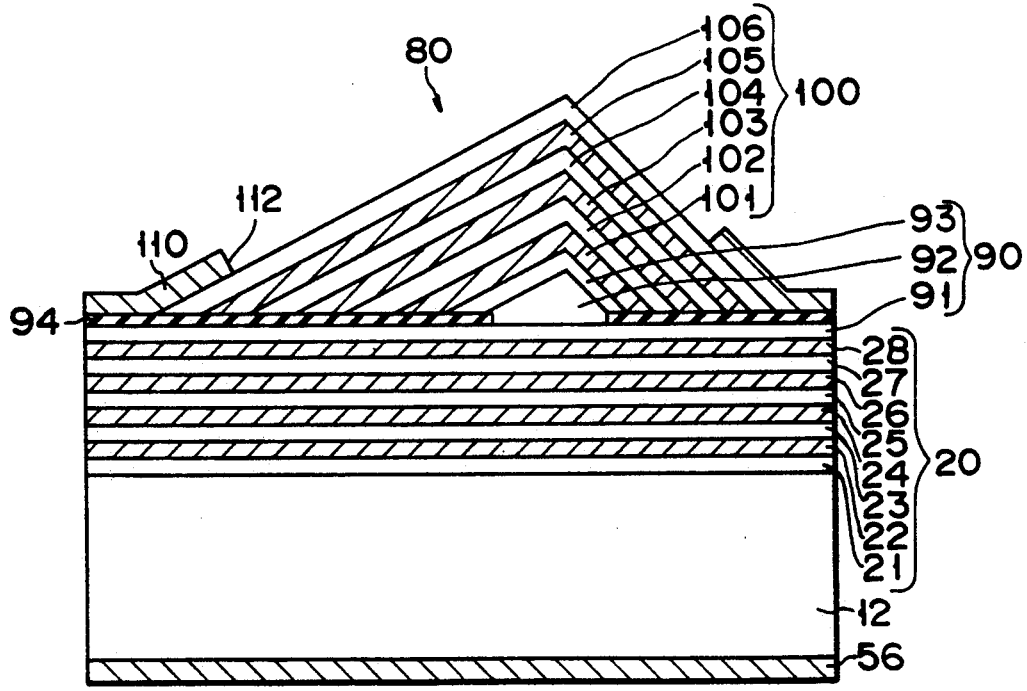
FIG. 7 shows a cross-sectional view of the laser of FIG. 7 along line VII—VII.

Another microcavity semiconductor laser 80 is illustrated in FIG. 6, wherein a triangular pyramid-shaped Bragg reflector structure is employed for the upper multi-layered section of n type conductivity. The main cross-section of laser 80 is illustrated in FIG. 7. This laser 80 is similar to the previously described lasers 10, 70 in that its lower reflector 20 includes a plurality of flat thin layers 21 to 28 sequentially laminated on substrate 12. Laser 80 differs from them in that a double-heterostructure (DHS) section 90 includes a triangular pyramid-like active layer 92 that is sandwiched between spacer layers 91, 93. These spacer layers may be made from $Al_{0.3}Ga_{0.7}As$. The lower, flat spacer layer 91 has a flat top surface around active layer 92, on which a silicon oxide thin-film 94 is arranged as shown in FIG. 7.

A second, p-type Bragg reflector structure section 100 is arranged on the triangular pyramid-like spacer layer 93 such that $Al_{0.8}Ga_{0.2}As$ layers 101, 103, 105 and $Al_{0.3}Ga_{0.7}As$ layers 102, 104, 106 are stacked alternately. Each layer is λ/4 thick. A conductive layer 110 is arranged as an electrode on the uppermost layer 106 with an triangular opening 112, which covers slightly the "foothill" portion of the exposed pyramid-like portion of layer 106, as illustrated in FIG. 6.

The laser 80 may be manufactured by using one of the presently available crystal growth techniques. In such a case, the existence of dependency on crystal-growing direction works to define the pyramid-like structure of Bragg reflector 100. When the crystal face of the top surface of flat spacer layer 91 is [111], the resultant crystal faces of three slanted surfaces of the pyramid structure are [110], [011], and [101]. Thus, this pyramid-like structure exhibits the tetrahedral symmetry.

More specifically, after the flat spacer layer 91 is formed using the MOCVD method, silicon-oxide thin-film 94 is deposited. This film is then subjected to a patterning process, thereby to form an opening substantially corresponding in shape to the triangular bottom surface of the pyramid-like active layer 92. This triangular opening has three edge lines, which are equal in length to one another. Each edge may be 0.1 micrometer. A selective crystal growth is carried out with the patterned silicon-oxide layer 94 being as a mask; as a result, layers 93, 101 to 106 of uniform thickness are stacked in this order. The selective crystal growth technique has been described typically in T. Fukui et al., "Extended Abstract of the 22nd International Conference on Solid State devices and Material," Sendai, Japan (1990) at pp. 99-102. In the resulting laser device, silicon-oxide thin-film 94 functions as a current-blocking layer.

Figure 8:
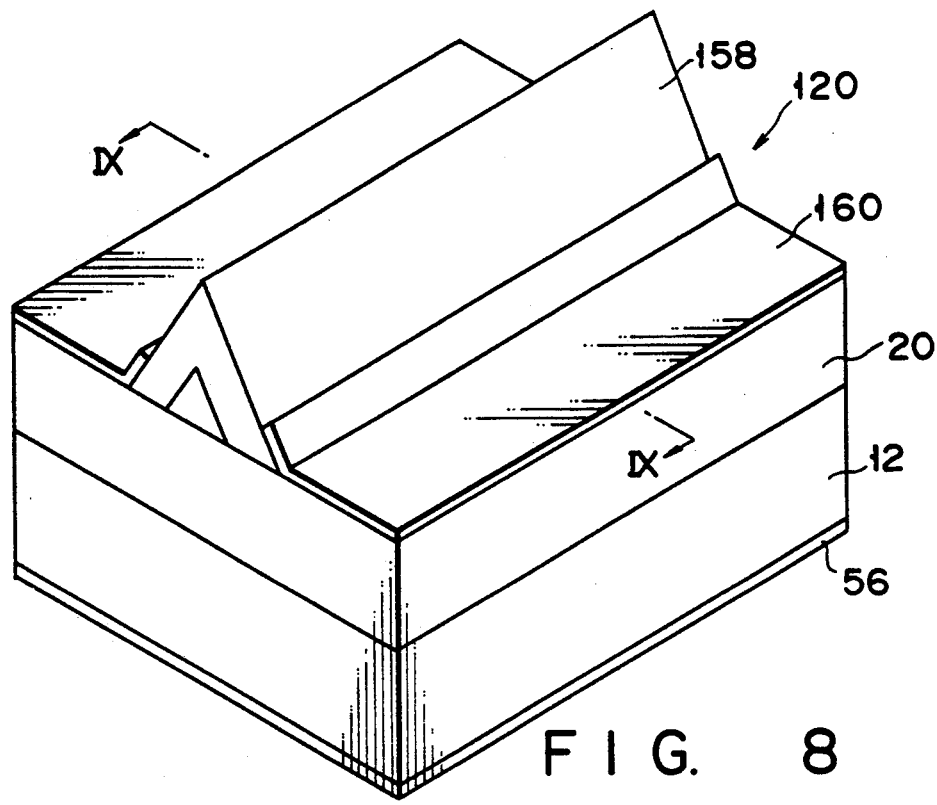
FIG. 8 is a diagram showing a perspective view of a semiconductor laser in accordance with a still another embodiment of the invention.
Figure 9:
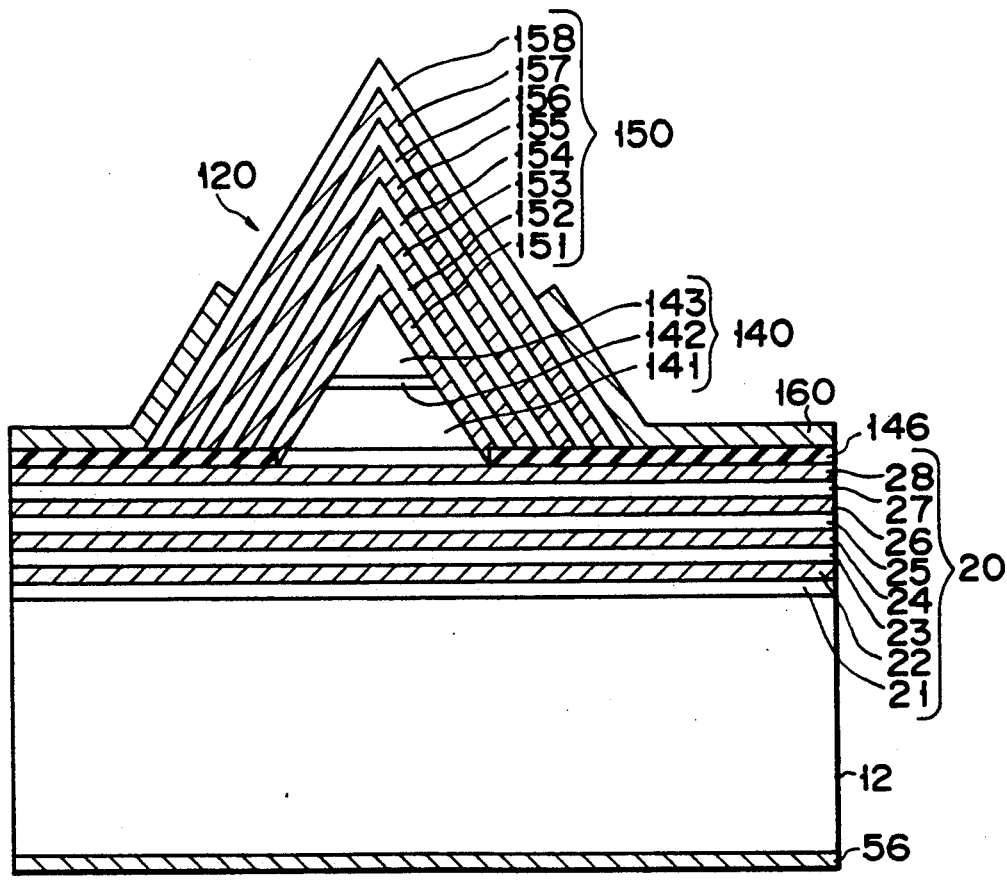
FIG. 9 shows a cross-sectional view of the laser of FIG. 7 along line IX—IX.

Another laser 120 is illustrated in FIG. 8, wherein the laser 120 employs a triangular prism-shaped multi-layered structure as its upper Bragg reflector 150 of n type conductivity. The main cross section of laser 120 is illustrated in FIG. 9. Laser 120 is similar to that of FIGS. 6 and 7 in terms of the lower Bragg reflector 20 that consist of a given number of flat thin-films 21-28.

The characteristic feature of laser 120 is that a double-heterostructure (DHS) section 140 has the triangular prism-like shape, the perspective view of which is apparent from FIG. 8. This triangular prism-like section 140 may consist of a lamination of three layers 141, 142, 143, which are made from similar materials to those in the embodiments 10, 70, 80. Layer 141 is a lower spacer layer, which has a mesa-shaped profile and is positioned in an elongated rectangular opening of a silicon-oxide thin-film 146 on layer 28. Layer 142 is an InGaAs active layer Layer 143 is an upper spacer layer, which has a triangular profile and is made from the same material as layer 141.

As shown in FIG. 9, $Al_{0.8}Ga_{0.2}As$ layers 151, 153, 155, 157 and $Al_{0.3}Ga_{0.7}As$ layers 152, 154, 156, 158 are alternately stacked on the triangular prism-like DHS section 140. A conductive layer 160 is arranged on silicon oxide layer 146 to cover the "foothill" portion of layer 158 as shown in FIG. 8 or 9; FIG. 8 shows more descriptively the appearance of layer 160.

The triangular prism-like microcavity laser 120 may be manufactured successfully by using one of the presently available selective crystal growth techniques. Preferably, substrate 12 is a gallium-arsenide layer having its top surface, the crystal face of which is (001). A silicon-oxide mask layer 146 is formed on substrate 12. Layer 146 is then patterned to define therein a stripe-shaped opening. This opening extends linearly along the crystal direction [110]. Layers 141, 142, 143 constituting the DHS section 140 are selectively grown so that they are laminated sequentially in the opening. The selective crystal growth technique may be employed which is carried out similarly as in the manufacture of laser 80 shown in FIGS. 6 and 7.

With the laser 120, while the coupling ratio β cannot be improved so much as in the triangular-pyramid-shaped microcavity laser 80 of FIGS. 6 and 7, the manufacturing process can be made easier. One reason for this is that, even if the opening in mask layer 146 is widen, the width of active layer 142 can be easily decreased based on the inherent shape of the triangular-prism structure.

Figure 10:
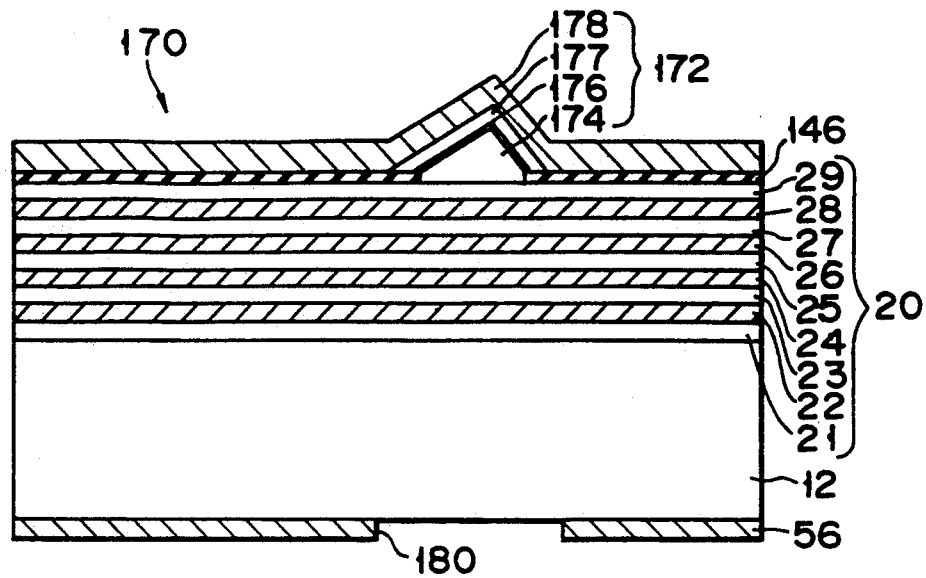
FIG. 10 is a cross-sectional view of a semiconductor laser in accordance with a further embodiment of the invention.

A microcavity laser device 170 in accordance with a fourth embodiment of the present invention is shown in FIG. 10, wherein $Al_{0.8}Ga_{0.2}As$ layers 21, 23, 25, 27, 29 and $Al_{0.3}Ga_{0.7}As$ layers 22, 24, 26, 28 are alternately stacked on substrate 12 in a similar manner as in the previous embodiments. A double-heterostructure (DHS) section 172 includes a bulged n-type spacer layer 174 arranged on a silicon-oxide mask layer 146, an InGaAs active layer 176, a p-type spacer layer 177, and a conductive thin-film layer 178 made from preselected metal. The thickness of spacer layer 177 may range from λ/4 to λ/5. Layer 178 is a refection layer, which also acts as an upper electrode for laser 170.

An ordinary double-layered structure of an AuZn layer and an Au layer (AuZn/Au) may be employed for the metal reflection layer 178. To eliminate any reduction in the reflectivity ratio between layer 178 and the underlying InGaAs layer 177, it is recommendable that layer 178 be made from one of the materials that do not contain zinc component, such as Ag/Au, Ti/Pt/Au, or the like. Layer 56 has an opening 180 for emission of output light. Also with such structure, the coupling ratio of spontaneous emission with the oscillation resonance mode can be increased due to the presence of the projected portion in the DHS section. This enables of extra-low threshold current oscillation. Additionally, this embodiment is superior than the above ones in its simple structure.

The aforementioned concept of decreasing the threshold current level by increasing the coupling ratio β of spontaneous emission with the oscillation mode in the microcavity semiconductor lasers of this invention will also be achieved satisfactorily in the following embodiments. These embodiments are featured in that the spontaneous emission coupling ratio β is enhanced by employing the following arrangements: (1) the vertical cavity is formed of a pair of distributed Bragg reflectors parallel with the substrate surface, and (2) the horizontal cavity is formed of the even-order grating-like configuration arrangement.

Figure 11:
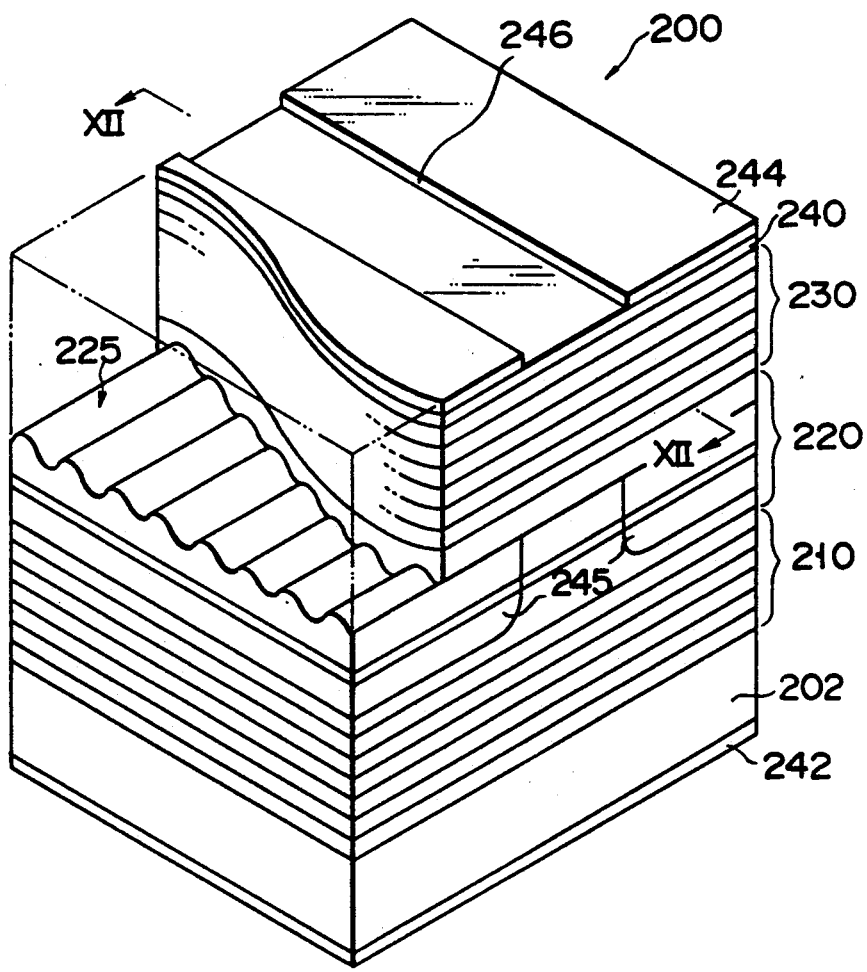
FIG. 11 is a diagram showing a perspective and partly broken view of a semiconductor laser in accordance with an embodiment of the invention.

Firstly, a low-threshold current microcavity semiconductor laser 200 is shown in FIG. 11, wherein the laser 200 is illustrated in a partially broken view for purposes of illustration. Laser 200 has a substrate 202, which may be a GaAs layer doped with an n-type impurity to a concentration of $2 \times 10^{18}$ cm$^{-3}$. On substrate 202, first multi-layered section 210, a DHS section 220, a second multi-layered section 230, and a contact layer 240 are sequentially stacked in this order. Contact layer 240 may be a GaAs thin-film. The upper and lower multi-layered sections 210, 230 are provided as first and second distributed Bragg-reflectors, respectively Electrodes 242, 244 are arranged on the upper and lower surfaces of laser 200, that is, on the bottom surface of substrate 202 and on the top surface of contact layer 240, respectively. The upper electrode 242 has an elongated opening, from which an output light is sent forth externally. Electrode 242 will be referred to as the "n-side electrode," whereas electrode 244 as "p-side electrode." Proton-implanted regions 245 are defined in section 220 as shown in FIG. 11.

Figure 12:
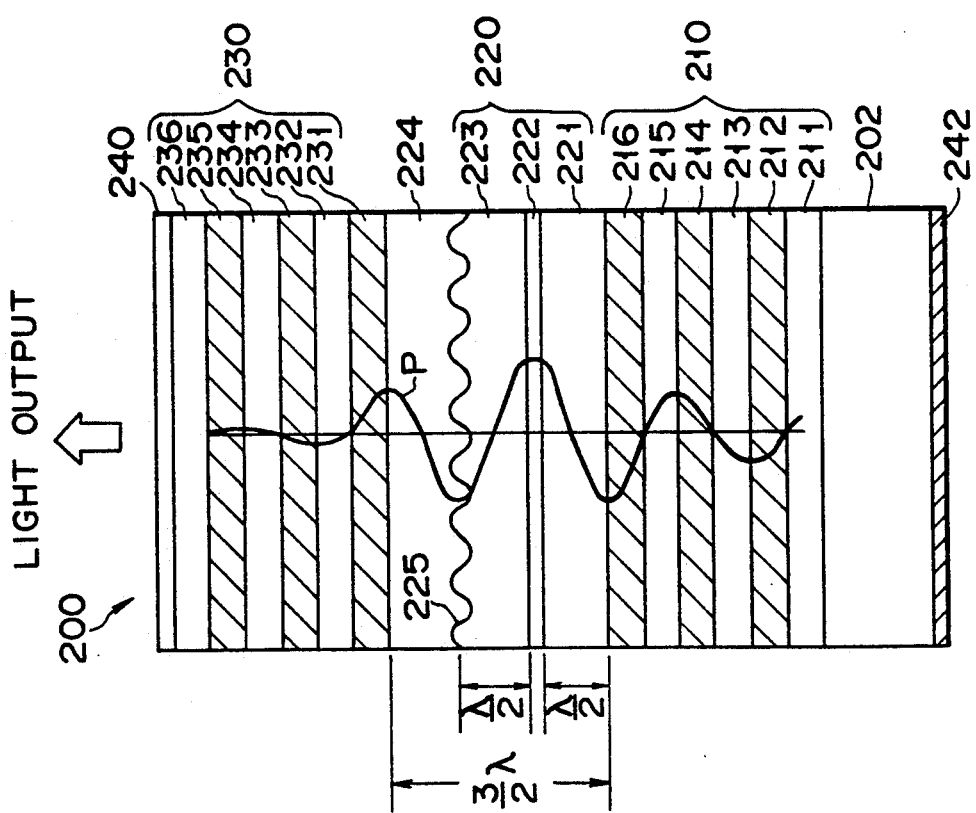
FIG. 12 shows a cross-sectional view of the laser of FIG. 11 along line XII—XII.

The main profile of laser 200 along line XII—XII is shown in further detail in FIG. 12. First distributed Bragg reflector 210 includes an alternate lamination of two kinds of semiconductive layers that are different in composition ratio from each other: $Al_{0.3}Ga_{0.7}As$ layers 211, 213, 215, and $Al_{0.8}Ga_{0.2}As$ layers 212, 214, 216 (hatched in FIG. 12). Second distributed Bragg-reflector 230 is arranged similarly: it includes $Al_{0.8}Ga_{0.2}As$ layers 231, 233, 235 (hatched), and $Al_{0.3}Ga_{0.7}As$ layers 232, 234, 236, which are alternately laminated. First and second reflectors 210, 230 differ from each other in that, while layers 211 to 216 are doped with an n-type impurity at a concentration of $2 \times 10^{18}$ cm$^{-3}$, layers 231-236 are with a p-type impurity to the same concentration.

Note that the thickness of each layer of first and second distributed Bragg reflectors 210, 230 is specifically determined to be a multiplied number of $\lambda/4$ by a given odd number, such as $\lambda/4$, $3\lambda/4$, $5\lambda/4$, or the like, where "$\lambda$" is the peak value of luminescence wavelength of the quantum well in vacuum as has been previously described.

As shown in FIG. 12, the DHS section 220 of FIG. 11 includes an active layer 222, which may be a GaAs layer of a preselected thickness, for example, 10 nanometers (nm). Since this thickness value is equivalent to the wavelength of de Broglie wave, section 220 may be called the quantum-well structure section. Active layer 222 is sandwiched between cladding layers 221, 223. These layers are semiconductive layers of the opposite conductivity types. Layer 221 is made from n-type $Al_{0.3}Ga_{0.7}As$, while layer 223 is from p-type $Al_{0.3}Ga_{0.7}As$. DHS section 220 further includes a buffer layer 224, which is arranged on cladding layer 223.

Very importantly, the upper cladding layer 223 is unique in its top surface configuration, which is corrugated or fluted at constant intervals to provide a parallel round-beveled teeth surface. This surface configuration is more apparently in FIG. 11. The unique surface configuration may be referred to as the "grating" structure. The buffer layer 224 is laid on layer 223 to cover the corrugated surface 225. Obviously, the interface (hetero-interface) between these layers 223, 224 is also corrugated.

As shown in FIG. 12, the thickness of lower cladding layer 221 in DHS section 220 is also carefully selected to be $\lambda/2$. This enables active layer 222 to be vertically spaced apart by $\lambda/2$ from the top surface of layer 221. Similarly, the corrugated hetero-interface of grating structure 225 is arranged so that it is located at a specific position where the interface is vertically spaced apart by $\lambda/2$ from the top surface of the underlying active layer 222. As apparent from FIG. 12, the total thickness (optical distance) of DHS section 220 is $3\lambda/2$.

The internal electromagnetic wave mode of laser 200 is represented by waveform P in FIG. 12. The previously described selection of the thickness values of layers 221, 223 causes quantum well active layer 222 to be located at a specific position corresponding to an antinode of waveform P in its middle range. Spontaneous emission can thus be enhanced. The above thickness selection also causes the corrugated hetero surface 225 to be located at another antinode of waveform P in the middle range. As a result, the coupling between the electromagnetic wave and the grating structure can be enhanced. (Similar effect may be obtained even when the positions of corrugated hetero interface 225 and active layer 222 are replaced with each other.) Horizontal spontaneous emission component, which will flow away horizontally out of device 200 when grating structure 225 is not provided, can be guided to progress vertically due to diffraction by the corrugated heterointerface 225, thereby to accelerating workless component of horizontal spontaneous emission to be coupled successfully with the oscillation (lasing) mode. The threshold current level of laser 200 can thus be decreased.

Figure 13:
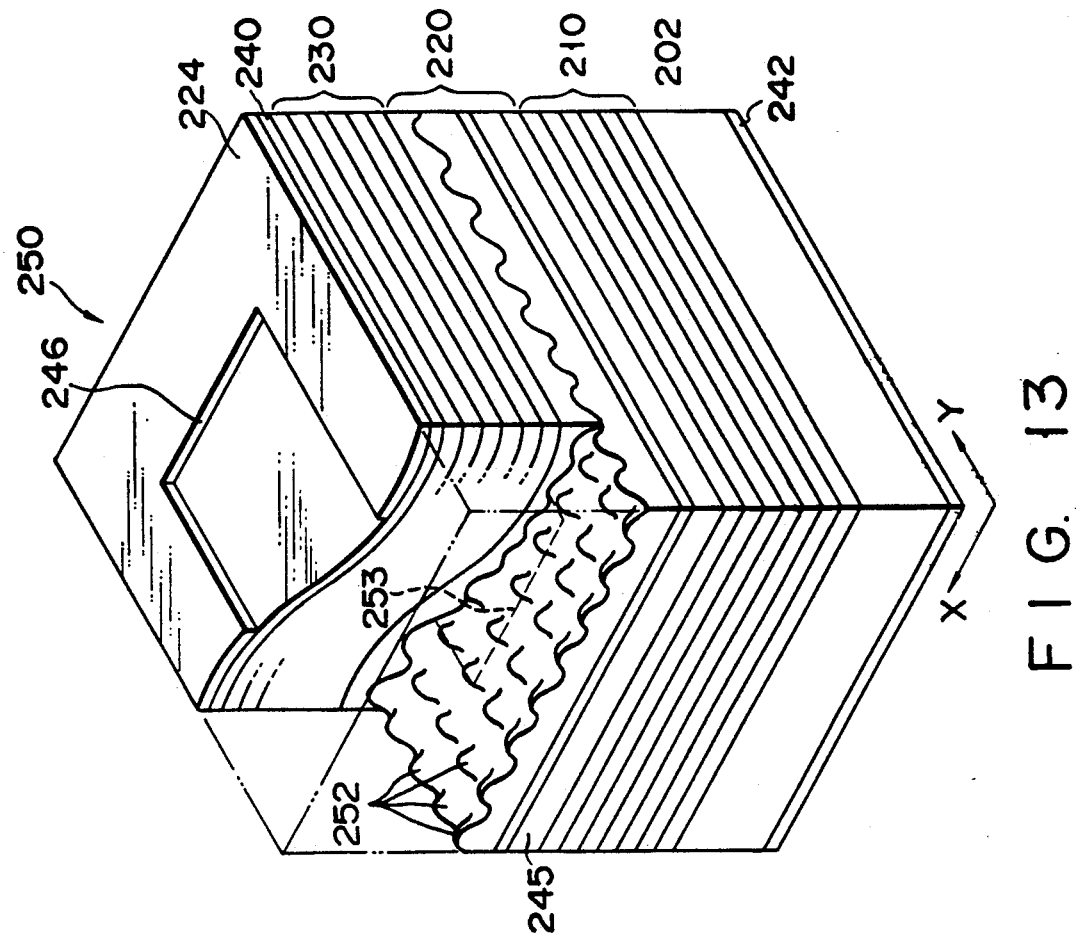
FIG. 13 is a diagram showing a perspective and partly broken view of a semiconductor laser which is one possible modification of the laser of FIG. 11.

One possible modification of the laser 200 is shown in FIG. 13, wherein a laser 250 has a plurality of rows and columns of round protuberances 252 on the top surface of cladding layer 223; these protuberances define the hetero-interface between cladding layer 223 and buffer layer 224 in the DHS section 220. Protuberances 252 are equal to one another in shape, height, and pitch on cladding layer 221. A proton-implanted region 245 is formed in section 220 to correspond in planar shape to the upper electrode 224 having a rectangular light-output opening 246. Dotted line 253 is added in FIG. 13 to represent a proton-vacant region in section 220. The matrix-arranged protuberances 252 may be fabricated by either performing the known electron-beam exposure process or repeating the interference exposure process for two times. With such a hetero-interface arrangement, the hetero-interface profile along each of X- and Y-directions of FIG. 13 (the definition of these direction is not the absolute one) is similar to that shown in FIG. 12. The coupling ratio $\beta$ of spontaneous emission can be improved both in the X- and Y-directions, whereby the threshold current level can thus be further lowered.

Figure 14:
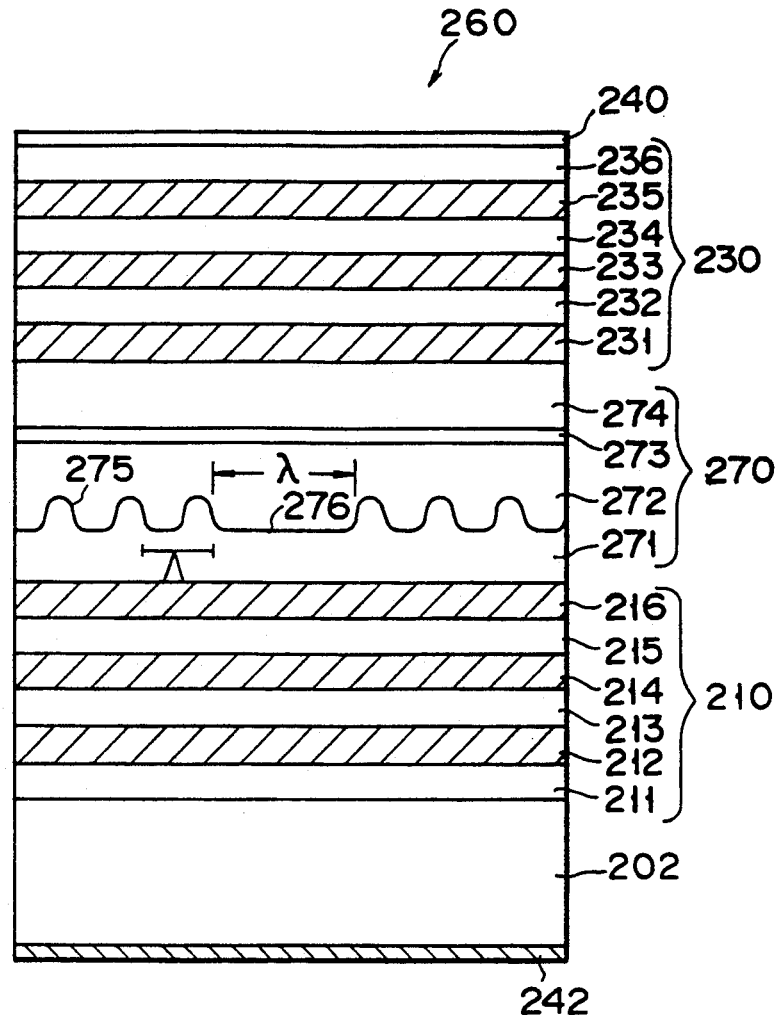
FIG. 14 is a diagram showing in cross-section a semiconductor laser which is another possible modification of the laser of FIG. 11.

Another modification of the laser 200 is shown in FIG. 14, wherein a laser 260 differs from laser 200 in that the positions of active layer 222 and the heterointerface of DHS section 220, and in that the configuration of corrugated hetero-surface section therein. In FIG. 14, similar components of laser are designated by similar reference numerals in FIG. 12, and a detailed explanation therefor is omitted.

More specifically, as shown in FIG. 14, laser 260 includes a double-heterostructure (DHS) section 270 sandwiched between the distributed Bragg reflectors 210, 230. Double-heterostructure section 270 includes a buffer layer 271, a first cladding layer 272, an active layer 273, and a second cladding layer 274, which are stacked sequentially in this order. Buffer layer 271 is similar in composition to the buffer layer 22 of FIG. 12; layers 272, 273, 274 are similar to the layers 221, 222, 223 shown in FIG. 12, respectively.

Figure 15:
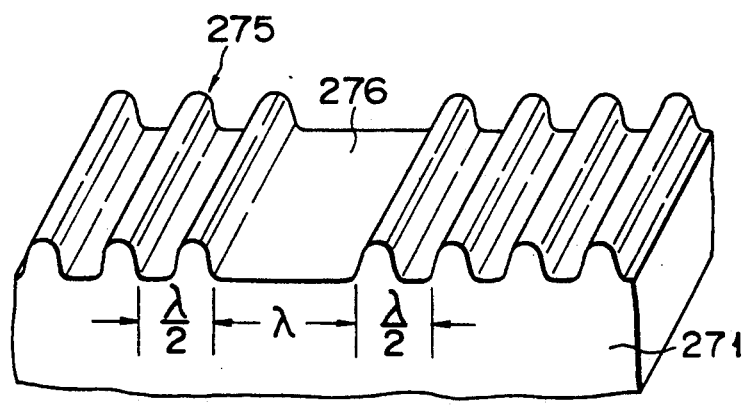
FIG. 15 shows an enlarged cross-sectional view of the laser of FIG. 14.

A corrugated hetero-interface section 275 is defined between buffer layer 271 and cladding layer 272, both of which are located beneath active layer 273. The "grating" arrangement of hetero-interface section 275 is featured in that a partially flat surface section 276 is formed in the central area thereof to be located below the opening 246 of electrode 244, as illustrated in FIG. 14. The width of flat section 276 is substantially equal to λ. More specifically, as shown in more detail in FIG. 15, while the round ridge portions are arranged in parallel at intervals of λ/2, flat surface section 276 is λ in width. Typically, this may be obtained by preventing one ridge portion to be formed in the central position of layer 272, although the width of flat section 276 may be modified so as to be any multiplied number of λ/2 by a given integer greater than "1," such as λ, 3λ/2, 2λ, or the like.

With the laser 260 of FIG. 14, the both side portions of flat surface section 276 can serve equivalently as a distributed Bragg reflector (DBR) means. Consequently, the spontaneous emission component along the horizontal (X) direction in the central region of hetero-interface section 275 ca be well controlled in the same manner as in the vertical direction of oscillation mode. Optical component horizontally progressing in the corrugated section is reflected back toward the central region by the both-side DBRs to minimize the work-less component along the horizontal direction. This can function to further improve the coupling ratio β of spontaneous emission, so that the threshold current level can be lowered.

Figure 16:
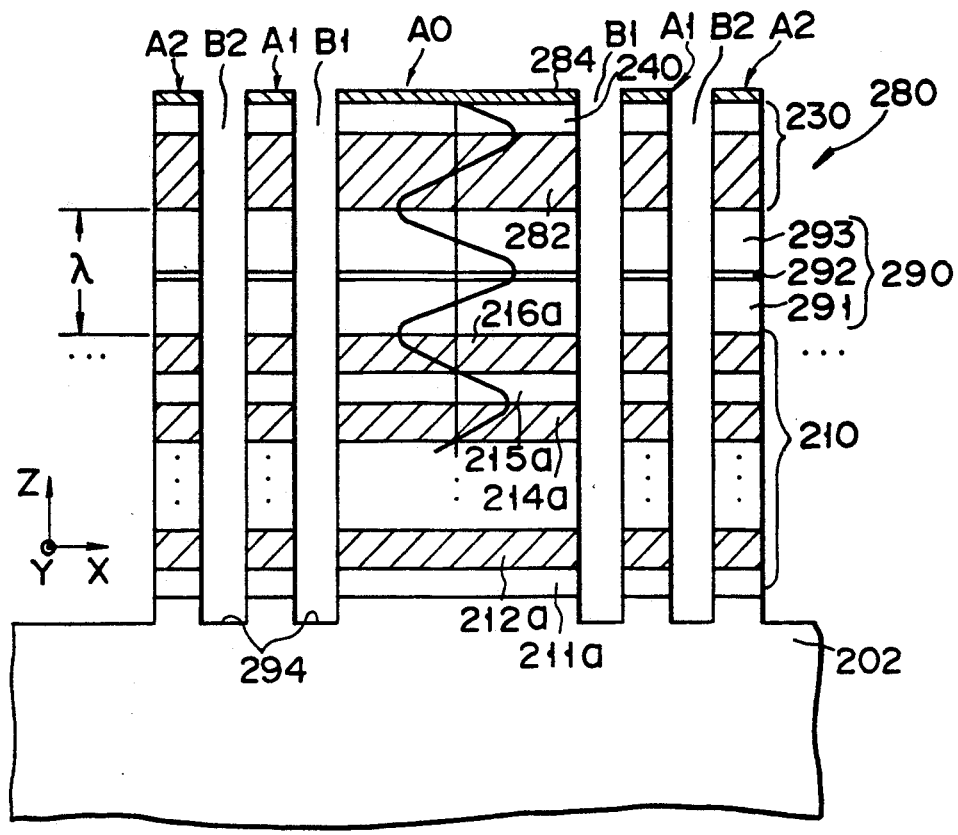
FIG. 16 is a diagram showing in major cross-section a semiconductor laser which is another embodiment of this invention.
Figure 17:
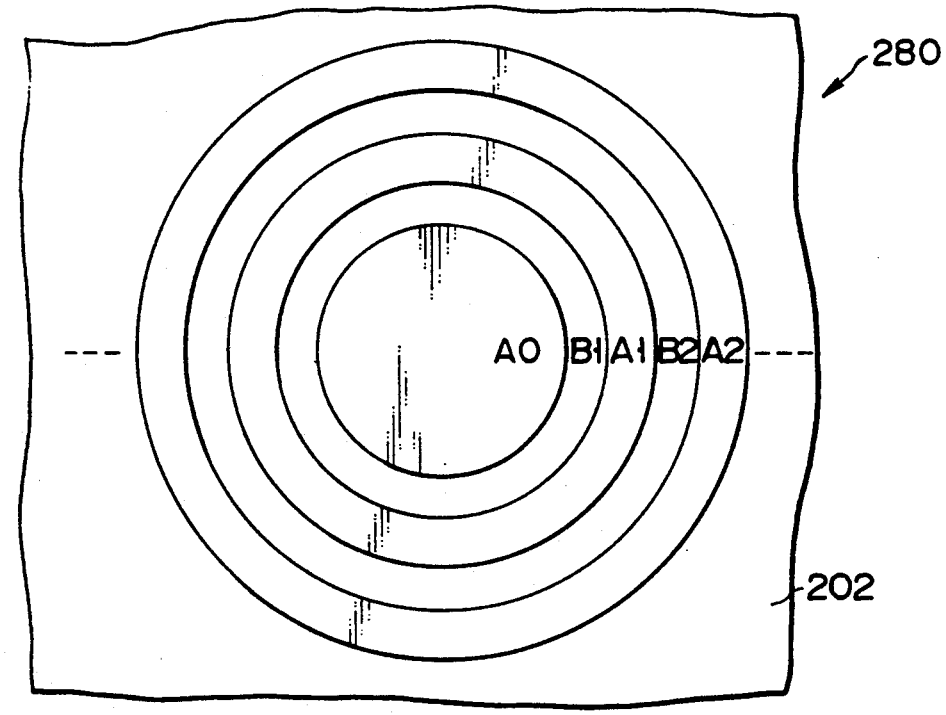
FIG. 17 shows a plan view of the laser of FIG. 16.

A laser 280 in accordance with a further embodiment of the invention is shown in FIG. 16, wherein this laser is similar to the embodiment 200 with its upper distributed Bragg reflector 230 being replaced by a single semiconductive layer 282, and with the aforementioned corrugated hetero-interface configuration being replaced with a plurality of narrow, deep and circular grooves B1, B2, ... formed in the stacked structure of distributed Bragg reflectors 210, 230 and DHS section 290 sandwiched therebetween as shown in FIG. 16. These grooves have plan shapes that are concentric circles as illustrated in FIG. 17. With these "ring-shaped" grooves B1, B2, ... , a plurality of thin and deep wall portions A1, A2, ... , which are ring-shaped correspondingly, are defined in laser 280. The ring-like plan shape of each wall section A1, A2, ... resembles a concentric circle. These wall sections will be referred to as the "fence sections," whereas grooves B as "gap sections" or more simply "gaps." The resultant structure defines at its center position a "circular cylinder" section A0, which is positioned in the center of ring-shaped fences A.

The semiconductive layer 282 may be an $Al_{0.8}Ga_{0.2}As$ material that is formed by a known crystal growth method to have a preselected thickness, which is typically λ/2. Layer 282 is provided with contact layer 240 thereon. A metallic layer 284 is arranged as a high-reflection layer on contact layer 240. Layer 284 is a thin film of silver (Ag) of 600 nm thick, for example.

The lower distributed-Bragg reflector 210 includes an alternate lamination of $Al_{0.3}Ga_{0.7}As$ layers 211a, 213a, 215 and $Al_{0.8}Ga_{0.2}As$ layers 212a, 214a, 216a. Each layer is doped with an n-type impurity to a concentration of $1\times10^{18}$ cm$^{-3}$; the thickness thereof is λ/4. The total thickness (optical length) of DHS section 290 is λ. The upper and lower cladding layers 291, 293 are specifically arranged so that the composition ratio of aluminum (Al) are exponentially varied in a range from 0.3 to 0.8 along a vertical direction Z (the definition of Z is not the absolute one; different definition may be utilized in some of the embodiments described later.) of laser 280. The Al composition ratio of layers 291, 293 is 0.3 in the vicinity of active layer 292, the potential well width of which is 7 nm; the same is 0.8 at the position far from active layer 292. Such variation of composition-ratio may be attained by using a molecular beam epitaxy method, a chemical beam epitaxy (CBE) method, or the like.

The depth of concentric ring-shaped gaps B is required to be at least greater than the total thickness of the DHS section 290, Bragg reflector 230, and high-reflection layer 284. In the embodiment these gaps B are formed so that their bottom portions 294 are formed in the surface of substrate 202 as shown in FIG. 16. Obviously, ring-shaped concave portions are formed on the substrate surface such that they correspond in planar shape to ring-shaped gaps B.

The diameter of circular cylinder section A0 is λ. The thickness of fences A1, A2, ... is substantially equal to the width of gaps B1, B2, ... in optical thickness; it may be any multiplied number of λ/4 by a given odd number, such as λ/4, 3λ/4, 5λ/4, or the like —λ/4, for example. Such fence-gap configuration may be formed using a known electron-beam exposure technique, reactive ion-etching (RIE) technique, or an ECR-RIBE technique. If required, gaps B may be buried with either a certain dielectric material or a semiconductive material, rather than with air as in the laser 280. In such cases, the width of gap sections B should be changed in accordance with the refractive index of the buried material; for example, 3λ/4.

With the laser 280, the circular fences A1, A2, ... and gaps B1, B2, ... can function as the high-reflectance films for horizontal emission components in a similar manner as in the above-mentioned corrugated heterointerface section 225 or protuberance-matrix interface section 252, whereby light confinement can be done horizontally to provide the three-dimensional light confinement effect. As a result, the coupling ratio β of spontaneous emission along the vertical direction can be improved to cause the threshold current level of laser 280 to decrease. For example, the threshold current can be easily decreased to several nanoamperes or less.

Figure 18:
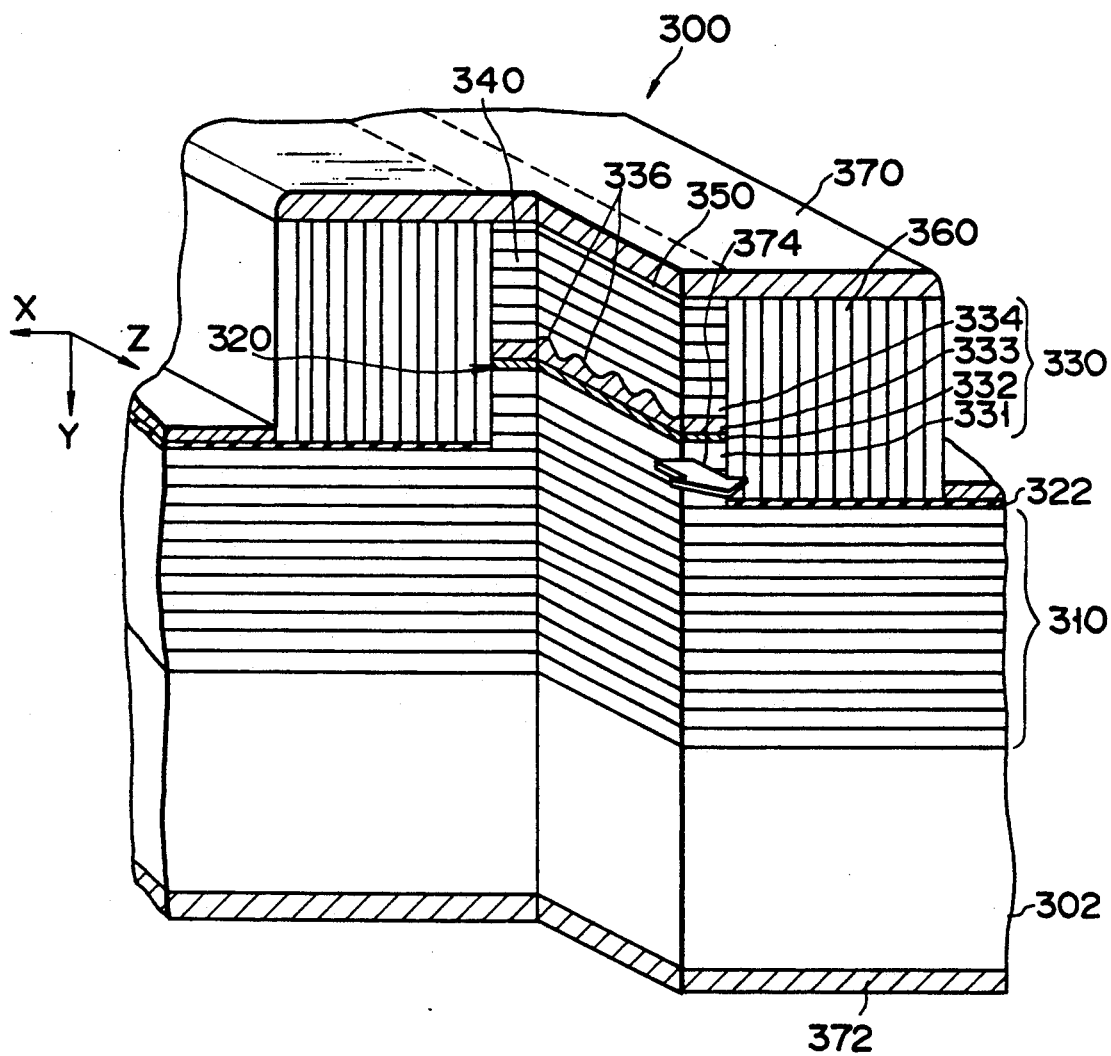
FIG. 18 is a diagram showing the perspective view of one of waveguide-type semiconductor lasers to which the present invention is also directed.

The present invention is also directed to the achievement of lowered threshold current level in waveguide semiconductor lasers, some of which will be described below. In FIG. 18, one of the lasers of this type is generally designated by numeral "300."

The laser 300 of FIG. 18 has an n-type GaAs substrate 302, on which a distributed Bragg reflector section 310 is arranged. Laser 300 is similar to the previously explained laser devices in that the multi-layered structure of section 310 consists of two different kinds of p-type semiconductor thin-film layers with different refractive indexes, which are alternately stacked on each other. These layers employ gallium-aluminum-arsenide as their base material; typically, these layers may be alternate lamination of $Ga_{1-a}Al_aAs$ high refractive-index layers and $Ga_{1-b}Al_bAs$ low refractive-index layers (where, $0<a<1$, $0<b<1$, $a<b$). Reflector section 310 includes an elongated rectangular ridge section 320 at its selected area. The top surface of reflector 310 on the both sides of ridge section 320 is covered by an insulative layer 322. Double-heterostructure section 330 is arranged in ridge section 320, and includes an n-type cladding layer 331, an active layer 332, a p-type waveguide layer 333, and a p-type cladding layer 334. A second distributed reflector section 340 (p-type) is formed on DHS section 330, and has a similar structure to that of the first reflector 310. The top surface of reflector 340 is covered by a p-type phase-matching layer 350.

As apparent from FIG. 18, a third distributed reflector section 360 is arranged on each of the two side walls of ridge section 320. This reflector 360 is similar to first and second reflectors 310, 340 in that it consists of two different kinds of semiconductor layers which are alternately laminated, except that these layers are laminated horizontally, rather than vertically. The layers for use in third reflector 360 are made from semi-insulating material. The optical thickness of each layer standing vertically is identical with the height of ridge 320 with layer 350. The overall top surface of the resultant laser structure is so flat that a p-side electrode 370 is uniformly disposed thereon. An n-side electrode 372 is formed on the bottom of substrate 302.

A detailed explanation of the DHS section 330 is as follows. Active layer 332 consists of a GaAs layer with the multiple quantum well structure. Waveguide layer 333 is made from p-type $Ga_{1-x}Al_xAs$ ($0 < x < 1$) material, having a parallel corrugated diffraction configuration 336 on its top surface. The profile of corrugated layer 333 along the longitudinal direction of ridge 32 looks like a series of round waves as shown in FIG. 18. The period of these waves is set at half the oscillation wavelength of laser 300 ($\lambda/2$). The lamination of layers 332, 333 is sandwiched between the upper and lower cladding layers 331, 334. Cladding layer 331 is made from n-type $Ga_{1-y}Al_yAs$ ($0 < y < 1$), and cladding layer 334 is from p-type $Ga_{1-y}Al_yAs$.

The main profile of ridge section 320 is enlargedly shown in FIGS. 19A and 19B. Fundamentally, there may be two possible laminating orders for the high-refractive-index layers and low-refractive index layers in first and second reflectors 310, 340 sandwiching DHS section 330 therebetween. One is that, as shown in FIG. 19A, the laminating order of high-refractive-index layers (hatched) in the upper half region is symmetrical with that in the lower half region with respect to the intermediate DHS section 330. The other is that, as shown in FIG. 19B, the laminating order of high-refractive-index layers in the upper half region is asymmetrical with that in the lower half region.

In the case of FIG. 19A, first reflector 310 consists of p-type high-refractive-index layers 311, 313, . . . and low-refractive-index layers 312, . . . which are alternately laminated; second reflector 340 consists of n-type high-refractive-index layers 341, 343, . . . and low-refractive-index layers 342, . . . , which are alternately laminated. Double-heterostructure section 330 is sandwiched between the uppermost high-refractive-index layer 341 of first reflector 310 and the lowermost high-refractive-index layer of second reflector 340. The optical thickness (multiplication of the actual thickness by the refractive index thereof) of each layer of first and second reflectors 310, 340 is $\lambda/4$. The aluminum composition ratio a and b of laminated high-refractive-index layers and low-refractive-index layers are arranged so that they are different from each other so as to cause the width of the optical forbidden band of the distributed reflection film to include the gain band of active layer 332. Naturally, the aluminum composition ratios x, y, a, b should be suitably arranged to cause the absorption of emission from active layer 332 to remain as small as possible. The optical thickness T and width W in the waveguide region are mode near the oscillation wavelength $\lambda$ due to Fabry-Perot mode produced by reflectors 310, 340. Typically, T and W are given as follows:

$$T = \lambda(2m-1)/4,$$

$$W = \lambda(2m''-1)/4,$$

where m, m' are positive integers. These equations teach that the total optical thickness of DHS section 330 is set at any multiplied value of $\lambda/4$ by an odd number.

In the case of FIG. 19B, the alternate lamination of n-type high-refractive-index layers 341, 343, . . . and low-refractive-index layers 342, . . . in second reflector 310 are opposite to that shown in FIG. 19A. Double-heterostructure section 330 is sandwiched between the uppermost high-refractive-index layer 311 of first reflector 310 and the lowermost low-refractive-index layer 342 of second reflector 340. The optical thickness T and width W of waveguide region is given as follows:

$$T = \lambda \cdot m/2,$$

$$W = \lambda(2m-1)/4.$$

This means that the total optical thickness of DHS section 330 is equal to a multiplied value of $\lambda/2$ by an even number.

The ridge structures of FIGS. 19A and 19B are same as each other in the alternate lamination arrangement of the third reflector 360, which consists of high-refractive-index layers 361, 363, . . . and low-refractive-index layers 362, 364, . . . . The innermost high-refractive-index layer 361 is adhered to the vertical side wall of ridge section 320. Phase-matching layer 350 is made from p-type $Ga_{1-c}Al_cAs$ ($0 < c < 1$); it acts to compensate for the difference between the phase variation in optical reflection at electrode 37 and that at reflector 340. The thickness of layer 350 is selected so that its optical length falls in a range from $\lambda/5$ to $\lambda/4$. Layer 350 may serve as a cap layer. Insulative layer 322 may be a silicon nitride film. This layer will act as a mask layer during the crystal growth process in the formation of layers 361, 362, 363, 364, . . . of third reflector 360; it may also act to eliminate current leakage through a metallic film which is inherently adhered to the side wall of these layers during an evaporation-formation of p-side electrode 370. P-side electrode 370 may be made from Au/Zn/Au material, whereas n-side electrode 372 is from AuGe/Au material. More preferably, these electrodes may be made from nonalloy metal such as pure Ag, Ag/Au, or Ti/Pt/Au in order to prevent decrease in reflectance and/or increase in optical absorption due to the existence of alloy in the interface with the semiconductor material. The output light appearing along the Z direction of laser 300 is represented by arrow 374.

The unique surrounding arrangement of DHS section 330 by three reflectors 310, 340, 360 enables the threshold current to decrease, since spontaneous emission components along the X- and Y-directions can be minimized, whereby the coupling of spontaneous emission with the waveguide mode along the Z-direction can be enhanced, as will be explained in detail hereafter.

Figure 20A:
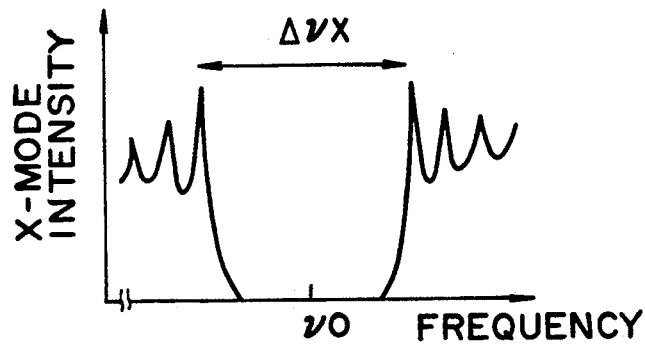
FIGS. 20A through 20D are graphs showing the mode intensity variations along the three primary directions X, Y and Z and the gain characteristic of the laser shown in FIG. 18.
Figure 20B:
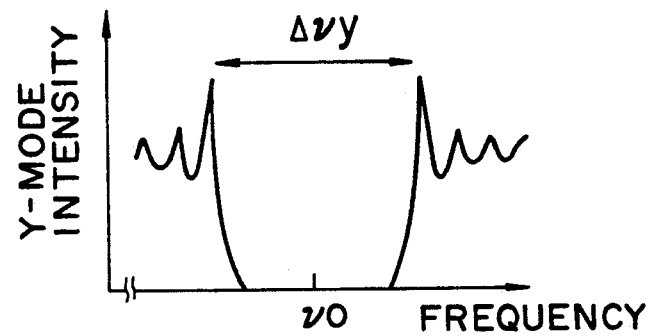
Figure 20C:
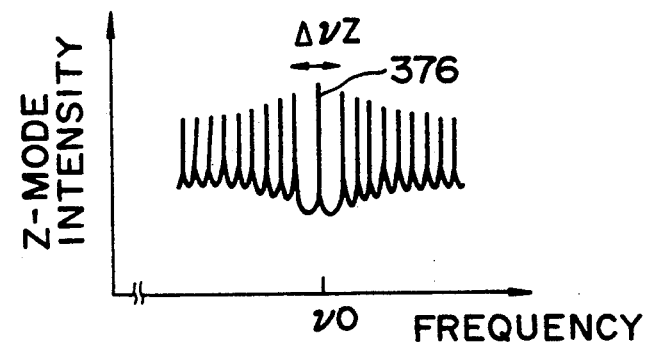
Figure 20D:
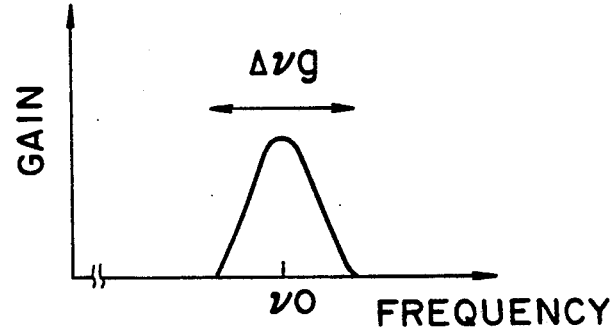

The spectra of the absolute values of electric field component of the electromagnetic field at the active layer of laser 300 in the three primary directions X, Y, Z are shown in FIGS. 20A to 20C, respectively. In these graphs, "$\nu 0$" means the Bragg frequency along the Z-direction, which determines the oscillation frequency of laser 300. FIG. 20D shows the gain spectrum of laser 300. As apparent from FIGS. 20A and 20B, optical forbidden bands $\Delta\nu_y$, $\Delta\nu_z$ contain $\nu 0$ point in the X-and Y-directions. Each forbidden band is greater in width than the effective frequency range $\Delta\nu g$ shown in FIG. 20D. This means that, with laser 300, spontaneous emission along the X- and Y-directions is eliminated throughout the overall region of the gain frequency; that is, the amount of spontaneous emission running away along these directions can be minimized. In contrast, the following two modes appear simultaneously along the Z-direction (the main direction of laser output): the DFB mode defined by the corrugated diffraction section 336, and the Fabry-Perot mode by lasing end surface. As a result, the maximum oscillation peak 376 appears desirably at the position of Bragg frequency $\nu 0$, which is the center of range $\Delta\nu g$. This determines the final oscillation mode of laser 300. The maximization of optical intensity in the main direction can cause the threshold current level to decrease.

Figure 21A:
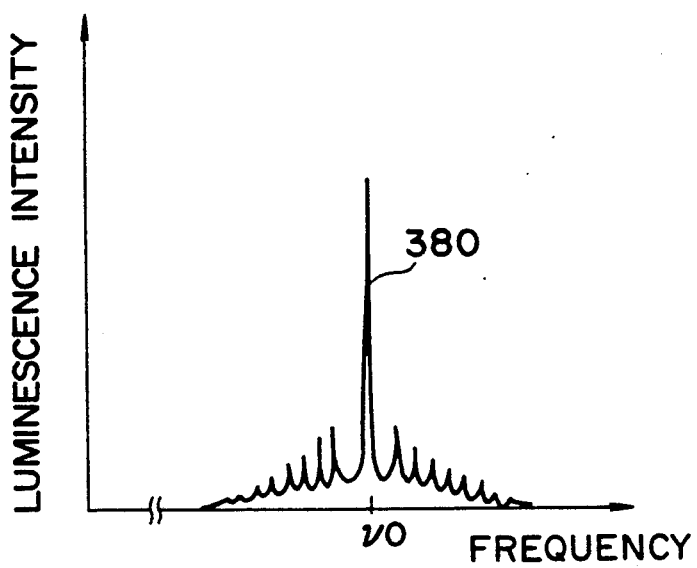
FIG. 21A is a graph showing the experimentally measured spontaneous emission spectrum of the laser shown in FIG. 18.
Figure 21B:
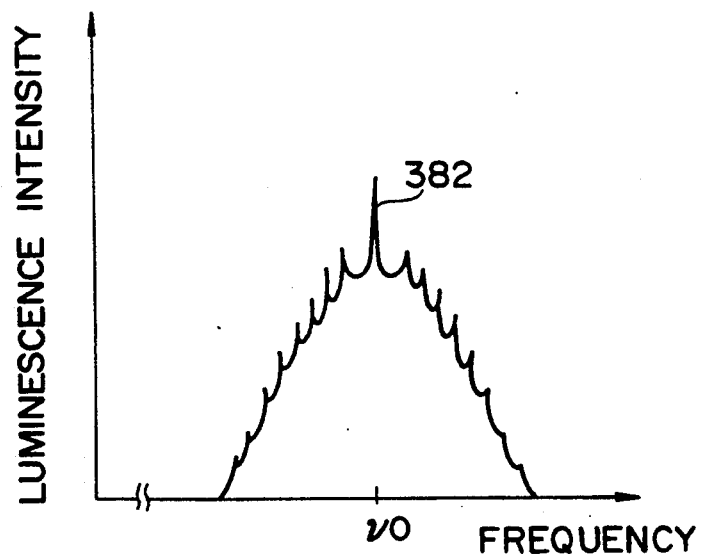
FIG. 21B is a graph showing the same of a prior-art laser device.

FIG. 21A shows the resultant spontaneous emission spectrum in laser 300. It has been demonstrated that the aforementioned specific distribution of electromagnetic wave mode results in a significant peak 380 appearing in the output light of active layer 332 at Bragg frequency $\nu 0$. The luminescence intensity at other frequencies other than $\nu 0$ can be kept low, which shows that insignificant component of spontaneous emission can be minimized. For comparison, the output light intensity versus frequency characteristic of a conventional laser of the same type without the above surrounding feature is shown in FIG. 21B. It is apparent from viewing these graphs that, according to the embodiment of this invention, the ratio of oscillation mode component (peak) 380 to the overall oscillation shown in FIG. 21A is greater by more than ten times than that of the conventional case shown in FIG. 21B. This may show that the laser 300 can be decreased in its threshold current level by 1/10.

In the laser 300, a quantum well layer of 0.01 micrometer thick is employed as active layer 332. In this case, the aluminum composition ratios of two kinds of stacked GaAlAs layers in the three reflectors 310, 340, 360 are set at 0.16 and 1.00, respectively. The number of laminated layers in each reflector should not be increases so much, when taking into consideration the increase in the internal optical absorption and the electrical resistance, and ease in the manufacturing process thereof. The use of twenty to thirty paris of high/low-refractive-index layers are recommendable in the first and third reflectors 310, 360; in the second reflector 340, five to fifteen pairs of high/low-refractive-index layers are recommendable.

Figure 22A:
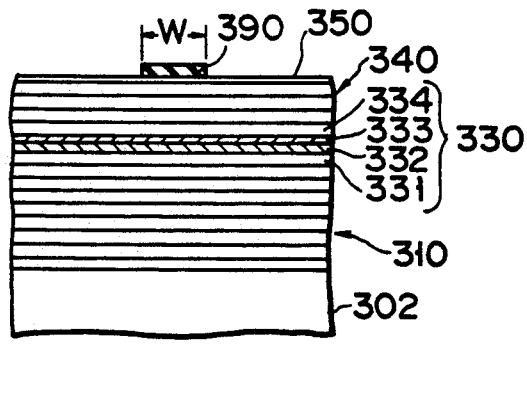
FIGS. 22A through 22F illustrate, in schematic cross-section, some of the major steps in the formation of the laser of FIG. 18.

The laser 300 of FIG. 18 may be fabricated by the presently-available manufacturing technique, which will be described with reference to FIGS. 22A through 22F. Firstly, as shown in FIG. 22A, multi-layered reflector 310 is formed by the epitaxial crystal growth method on n-type GaAs substrate 302. Cladding layer 331, active layer 332, and optical guide layer 333 are sequentially formed using the epitaxial crystal growth process. Layer 333 is then subjected to a patterning process, to form in its top surface the grating pattern shown in FIG. 18. This patterning process may be achieved by combining the wet etching with either one of two-beam interference exposure and the electron beam exposure.

On the patterned layer 333, another cladding layer 334 is crystal-grown. Another multi-layered reflector section 340 is formed by the epitaxial crystal growth process. On the top surface of the resultant structure, p-type $Ga_{1-c}Al_cAs$ phase-matching layer 350 is formed. A silicon dioxide layer 390 is deposited on layer 350. Layer 390 is patterned using the ordinary ultraviolet exposure or electron beam exposure technique, to thereby obtain a mask layer, which has the specific width W as has been described previously.

Figure 22B:
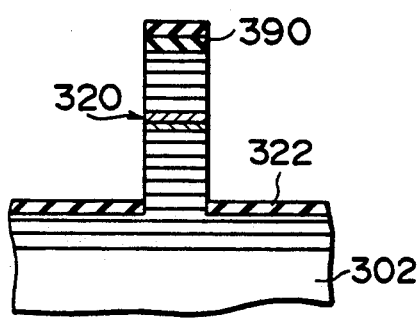

Subsequently, as shown in FIG. 22B, the underlying layers are etched using mask layer 390 to a predetermined depth, by a dry-etching process such as known ECR-RIBE method. The both side portions are then removed while ridge section 320 remains The etching depth should be determined to etch out at least a preselected number of the upper layers of reflector 310, whereby the waveguide section of laser 300 is formed. Then, silicon nitride layer 322 is formed uniformly on the resultant body, by using sputtering method, as shown in FIG. 22B.

Figure 22C:
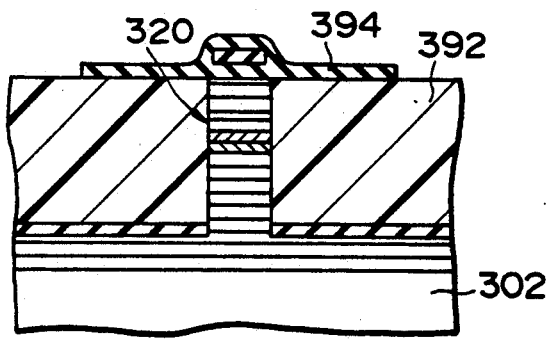

After removing silicon-nitride components adhered to the both sides of ridge-shaped waveguide section 320 by using hydrogen fluoride (HF) buffered by ammonia solution, the both sides of section 320 are buried with a resist layer 392 as shown in FIG. 22C. Resist layer 392 is processed to have a flat top surface. Oxygen-based RIE process is performed on the flat surface of resist layer 392, exposing mask layer 390. A silicon dioxide film 394 being wider than mask layer 390 is formed as a new mask layer. This layer 394 defines the total width of third reflector 360 shown in FIG. 19A or 19B.

Figure 22D:
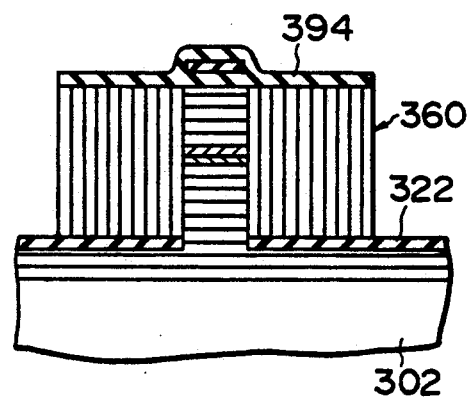

After removing resist layer 394 from the structure of FIG. 22C, wet etching process is carried out to etch out damaged portions on the vertical side walls of ridge-shaped waveguide section 320. Thereafter, as shown in FIG. 22D, multi-layered section 360 is formed by selective crystal growth method on the both sides of ridge section 320 as the third reflector.

Figure 22E:
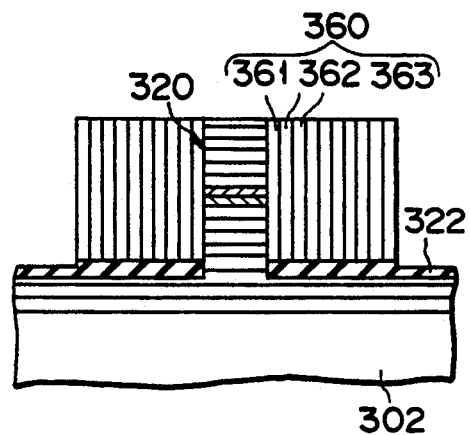

Subsequently, as shown in FIG. 22E, mask layer 390 is removed using etchant such as hydrogen fluoride solution. The etching rate in the silicon nitride is less than that in the silicon dioxide; therefore, larger part of silicon nitride film 322 remains, although it is slightly etched in the surface portion thereof.

Figure 22F:
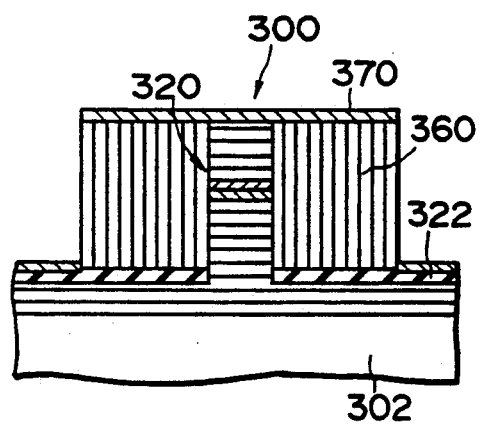

As shown in FIG. 22F, p-side electrode 370 is then formed using ordinary deposition process on the top surface (epitaxial surface) of the resultant structure. The end face thereof is subjected to a cleavage treatment. If required, a coating process may be added. An n-side electrode 372 (invisible in FIG. 22F) is formed on the bottom of substrate 302 (see FIG. 18), to complete the structure of laser 300.

Figure 23:
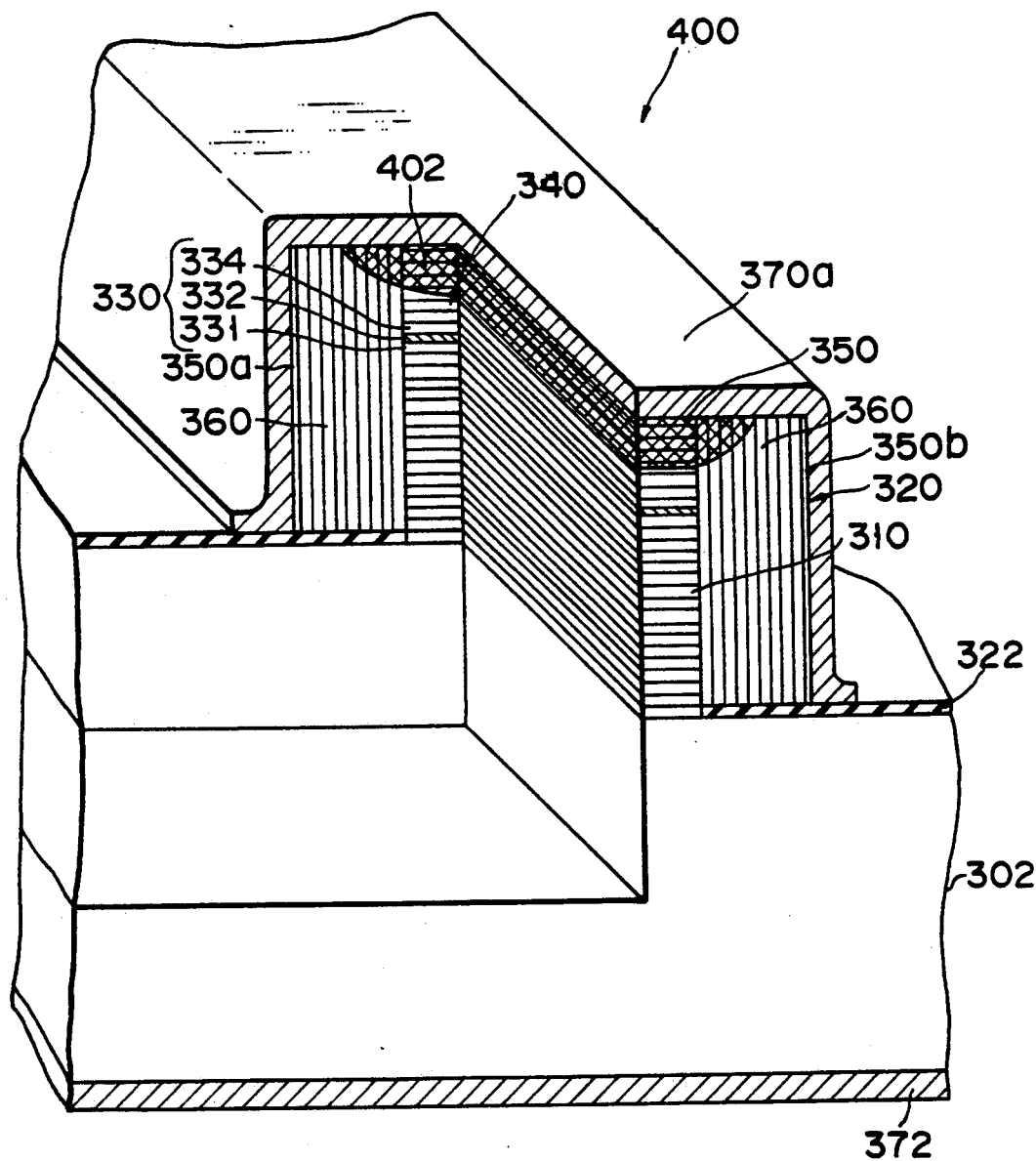
FIG. 23 is a diagram showing the perspective view of another one of waveguide type semiconductor lasers employing a cleaved surface structure to which the present invention is also directed.

Another laser 400 shown in FIG. 23 is similar to that of FIG. 18 except for the following three specific arrangements: (1) all of the three multi-layered reflectors are "packed" in a ridge section 320 on substrate 302; (2) the p-side electrode 370a is expanded to cover not only the top surface but also two side-wall surfaces of ridge section 320; and (3) ridge 320 is doped with a p-type impurity such as Zn at its top surface to form an impurity-doped region 402. DHS section 330 includes active layer 332 which is sandwiched between cladding layers 331, 334. Crystal-phase matching layers 350a, 350b are additionally arranged on the side walls of ridge section 320 such that they are sandwiched between these side walls and electrode 370a.

As shown in FIG. 23, the impurity-doped region 402 overlaps the second and third multi-layered reflectors 340, 360, which is arranged similarly to those of FIG.

19A or 19B. Region 402 is added causing a carrier flow path to be available between second reflector 340 and p-side electrode 370a.

The laser 400 is inferior to that of FIG. 18 in its weakness in the "threshold current decreasing" effect; however, this structure can provide alternative advantages of rendering the manufacturing process easy and of lightening the damage to active layer 332 during the manufacturing process. The easiness of manufacture of laser 400 will be discussed below.

Figure 24A:
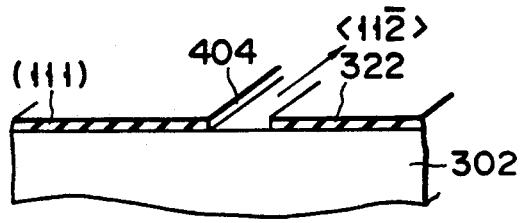
FIGS. 24A through 24E illustrate, in schematic cross-section, some of the major steps in the formation of the laser of FIG. 23.

As shown in FIG. 24A, insulating thin film 322 is formed on n-type GaAs substrate 302 having crystal face of (111). This film may be silicon nitride or silicon dioxide layer. Lithography process such as ultraviolet light exposure or electron beam exposure is performed to form a narrow stripe-shaped opening or groove 404 extending along the crystal axis $<1\ 1\ -2>$ on the substrate surface. Etchant such as hydrogen fluoride solution may be used.

Figure 24D:
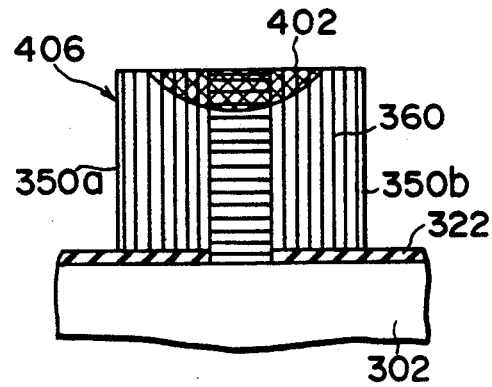
Figure 24B:
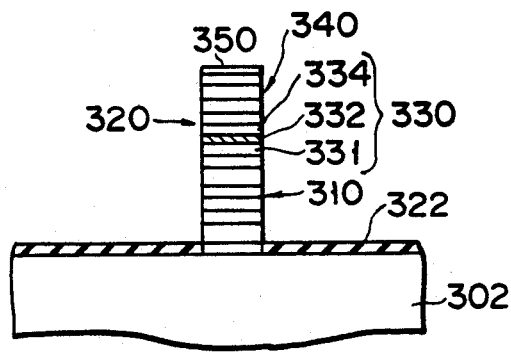

Subsequently, as shown in FIG. 24B, ridge section 320 consisting of multi-layered section 310, DHS section 330, another multi-layered section 340, and phase matching layer 350 is formed by MOCVD method with the patterned layer 322 being as a mask so as to have the same width as groove 404. The manufacturing conditions are as follows: The substrate temperature is as high as 800° C., and the pressure of arsine is as low as $6 \times 10^{-5}$ atm. The crystal growth rate along the direction $<111>$ vertical to the substrate surface is greater by twenty times than those along the directions $<1\ -1\ 0>$ and $<-1\ 1\ 0>$ parallel with the substrate surface.

Thereafter, the crystal growth conditions are changed so that the substrate temperature is 600° C., and the pressure of arsine is at $2 \times 10^{-4}$ atm. As a result, multi-layered high-resistance distributed reflector 360 as shown in FIG. 24C. A phase-matching layer 350a is formed by crystal growth on the outer vertical wall of section 360. During this crystal growth process, the crystal growth rate along the directions parallel with the substrate surface is greater than that along the vertical direction thereto. The extending direction of groove 404 may be possibly set in either $<2\ -1\ 1>$ or $<1\ -2\ 1>$. In the former case, the crystal growth in the FIG. 24C step is made along $<0\ 1\ -1>$ and $<0\ -1\ 1>$; in the latter case, it is along $<1\ 0\ -1>$ and $<-1\ 0\ 1>$.

Figure 24E:
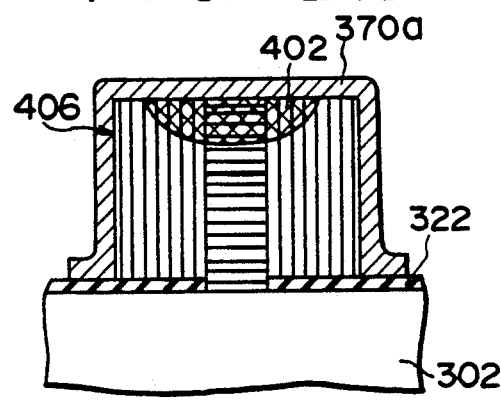
Figure 24C:
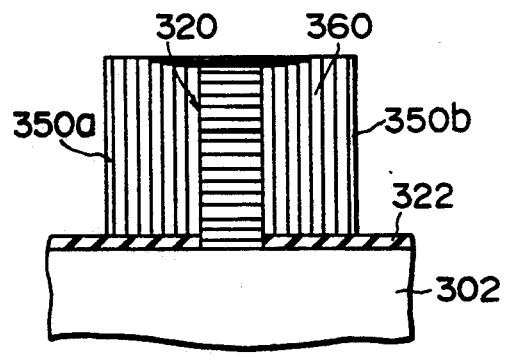

Impurity such as Zn is diffused into the top surface of the resultant vertically and horizontally grown structure 406, to form an impurity-doped region 402 as shown in FIG. 24D Thereafter, evaporation process is performed to form a metal layer 370a which entirely covers the structure 406 as shown in FIG. 24E. This is the p-side electrode. Electrode 372 is formed on the substrate bottom surface (see FIG. 23), thus completing laser 400.

Figure 25A:
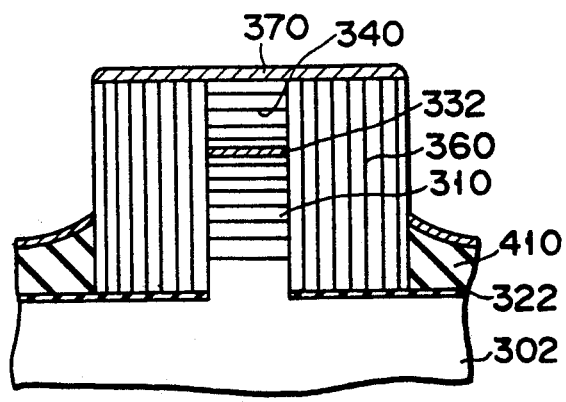
FIGS. 25A through 25E are diagrams showing some of possible modifications of the transversal cross-sectional waveguide structure of lasers shown in FIGS. 18 and 23.
Figure 25B:
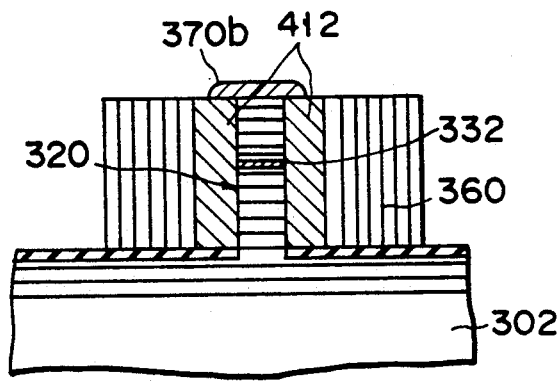
Figure 25D:
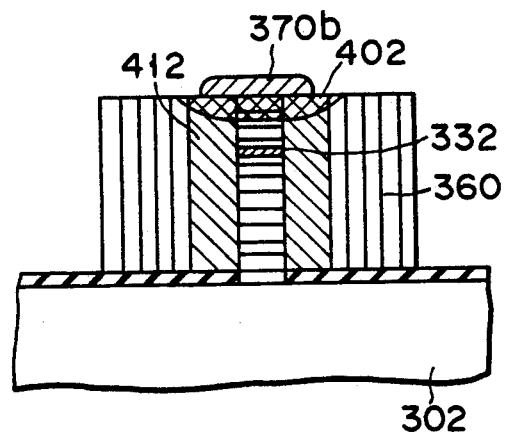
Figure 25C:
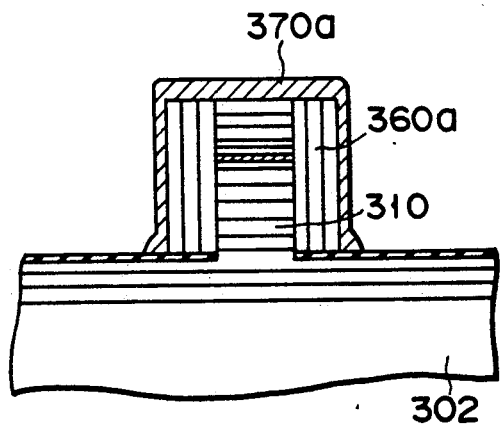
Figure 25E:
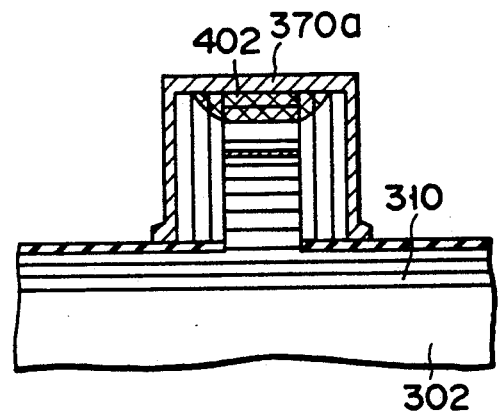

Some of possible modifications of the main cross-sectional structure (along direction X of FIG. 18) of lasers 300, 400 shown in FIGS. 18 and 23 are presented in FIGS. 25A to 25E, wherein FIGS. 25A to 25C show modifications of laser 300, and FIGS. 25D and 25E shows those of laser 400. According to the FIG. 25A structure, the etching process in the FIG. 22B step is performed so deeply enough to enable the surface of substrate 302 to be etched. Additional insulative layer 410 is arranged on layer 322 to strengthen the current leakage eliminating effect. Layer 410 is typically a polyamide-resin layer.

The cross-sectional structure of FIG. 25B is featured in that (1) the width of ridge section 320 is decreased, (2) active layer 332 is vertically sandwiched at its side edges by two cladding layers 412 additionally formed on side walls of ridge 320, and (3) p-side electrode 370b is partially removed at its peripheral portions to have its central portion only. The features #1, #2 improve the selectivity of transverse-oscillation mode of the laser; the feature #3 causes the inherent CR time constant to decrease to achieve high-speed modulation. The difference between the structures of FIGS. 25B and 25D is similar to that between those shown FIGS. 18 and 23, except for the fact that the FIG. 25D structure includes narrowed electrode 370b. Impurity-doped region 402 of FIG. 25D is similar to that of FIG. 23 in the function and fabrication method. The characteristic feature of a laser shown in FIG. 25C is that the third (high-resistance) reflector 360a is comprised of semiconductor layers, the total thickness which is decreased by one second, or less. With such arrangement, the manufacturing efficiency can be improved while maintaining the reflectance at a required value. The difference between the structures of FIGS. 25C and 25E is similar to that between the structures shown in FIG. 25B and 25D.

Figure 26A:
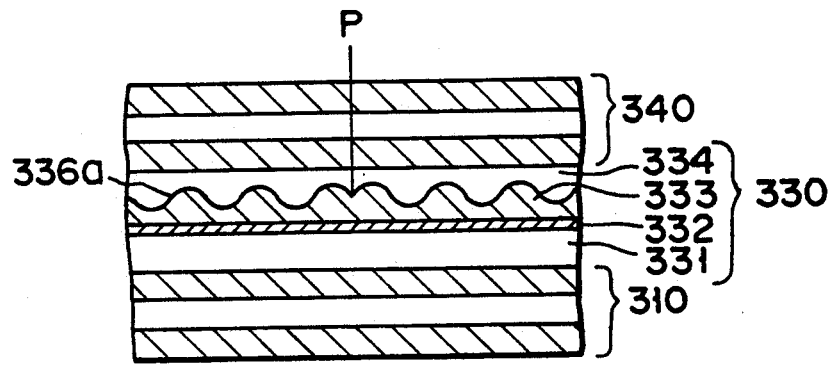
FIGS. 26A through 26C are diagrams showing some of possible modifications of the longitudinal cross-sectional waveguide structure of lasers shown in FIGS. 18 and 23.
Figure 26B:
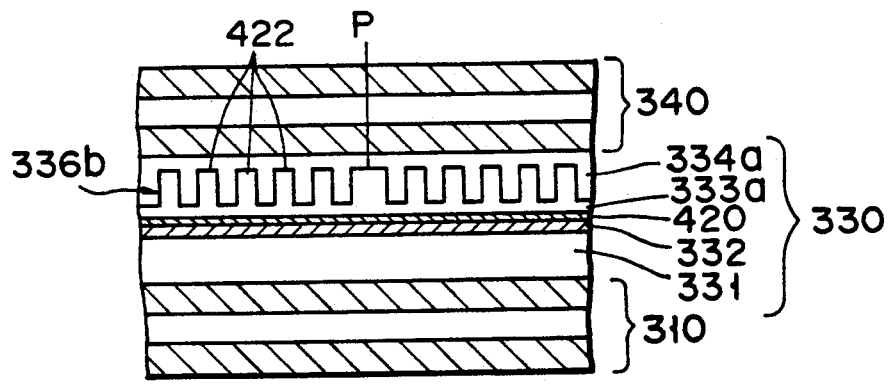
Figure 26C:
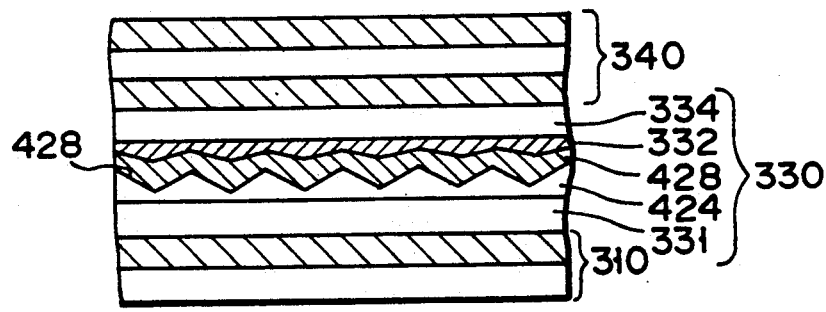

Some of possible modifications of the longitudinal cross-sectional structure (along direction Y of FIG. 18) of the lasers 300, 400 shown in FIGS. 18 and 23 are presented in FIGS. 26A to 26C. The structure shown in FIG. 26A is featured in the longitudinal waving pattern of a corrugated diffraction section 336, which is deviated in phase by $\pi/2$ (i.e., $\lambda/4$) at position P (folded pattern), whereby oscillation at Bragg frequency becomes available.

The FIG. 26B structure is featured in that (1) the "$\lambda/4$ phase-shift" structure of FIG. 26A is enhanced, and (2) a heavily-doped layer 420 is added between active layer 332 and optical guide layer 333. More specifically, corrugated grating section 336b consists of a series of rectangular projected portions 422, which are deviated in phase by $\lambda/4$ at the center position P. In other words, portions 422 has a folded-pattern. Deep portions 422 may be fabricated by the presently-available dry-etching method. Adding the layer 420 can prevent the current injection from being longitudinally modulated inside the waveguide path due to the deeply configured grating section 336b, thereby to obtain uniform current injection. This can eliminate the generation of undesirable gain-coupling.

The FIG. 26C structure is featured in that DHS section 300 includes a lamination of additional layers 424, 426 on n-type cladding layer 331. Layer 424 is a "pattern supply" layer having triangular corrugated configuration 428. Layer 426 is a buffer layer covering layer 424. With the active region thus laminated, there is obtained the so called "gain-coupled DFB" lasing structure. The gain-coupling is obtained due to the fact that the thickness of active layer 33 is "modulated" periodically. With employment of the gain-coupled waveguide structure to the laser device of the present invention, the coupling ratio of spontaneous emission to the oscillation mode can be much improved to enhance the "threshold current decreasing" effect more successfully.

The present invention is also directed to accomplishment of low-threshold current in the three-dimensional light-confinement microcavity semiconductor lasers. One embodiment thereof is shown FIG. 27, wherein a laser 500 is arranged so that its output light is taken out of the rear side of an n-type GaAs substrate 502. A circular cylinder section 504 stands on substrate 502 to include a coaxial round shank section 506. This section includes a sequential lamination of a silicon oxide layer 508, a first multi-layered distributed Bragg-reflector section 510, a double-heterostructure (DHS) section 520, a second multi-layered distributed Bragg-reflector section 530, and a cap layer 540. Each reflector 510, 530 consists of a plurality of pairs of high- and low-refractive index thin films, which are similar to those shown in the previous embodiments in composition and thickness (optical length of each film is $\lambda/4$) settings; aluminum-gallium-arsenide may be employed as the base material therefor.

The detailed structure of DHS section 520 is as follows. Active layer 522 may be a strained quantum well layer made from indium-gallium-arsenide ($In_pGa_{1-p}As$, $0.1 < p < 0.3$). Active layer 522 is sandwiched by the underlying n-type space layer 521 and the overlying p-type spacer layer 523. Layer 521 is made from $Al_qGa_{1-q}As$, whereas layer 523 is from $Al_rGa_{1-r}As$, wherein $0 < q < 1$, $0 < r < 1$. These spacer layers may also serve as barrier layer for active layer 522. If required, the composition ratio of aluminum q, r of spacer layers 521, 523 may be varied continuously or discontinuously along the laminating direction. Also, the doping density therein may be varied similarly. Spacer layers 521, 523 have the same thickness; the total thickness of DHS section 520 is "m $\lambda/2$," where m is a positive integer.

Figure 27:
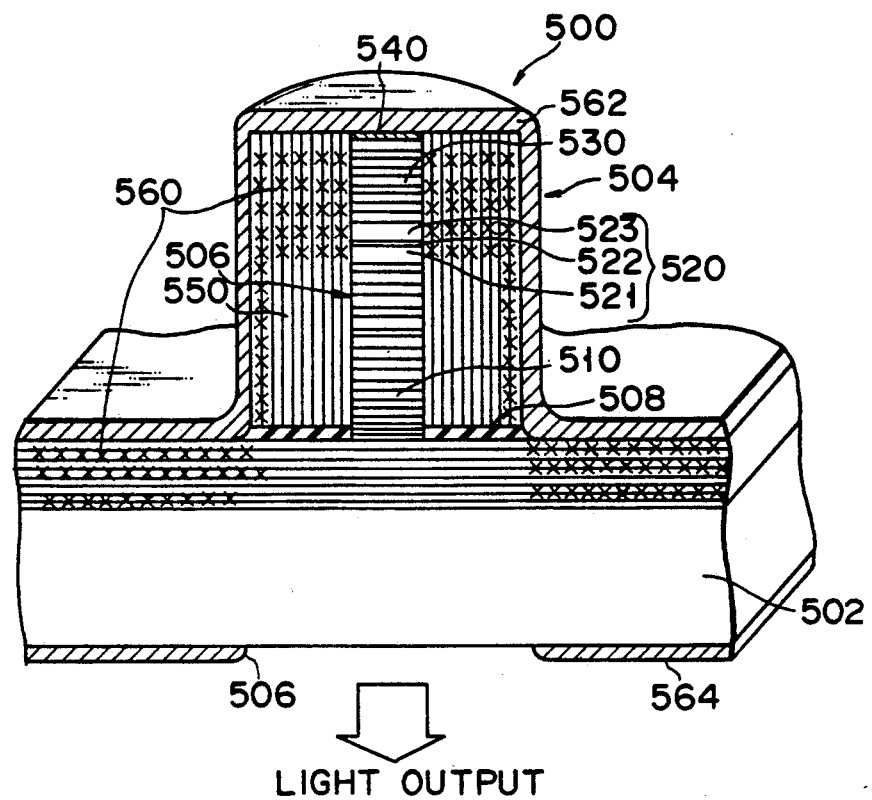
FIGS. 27 to 30 are diagrams showing the cross-sectional views of several semiconductor lasers in accordance with further embodiments of the present invention.

The round shank section 506 is provided with a third multi-layered distributed Bragg-reflector section 550, which covers the outer round side wall of section 506 as illustrated in FIG. 27. Third reflector 550 is similar to those in the previously described embodiments; non-doped aluminum-gallium-arsenide is employed as the base material therefor. First and third Bragg reflectors 510, 550 may be implanted with a proton to define therein a proton-implanted region 560, causing these reflectors to be greater in electric resistance. Circular cylinder section 504 with third reflector 550 is "sealed" by an conductive layer 562, which covers it entirely to serve as a p-side electrode of laser 500. An n-side electrode 564 is arranged on the rear surface of substrate 562; it has a circular opening 566, from which an oscillated light emits externally.

Figure 28:
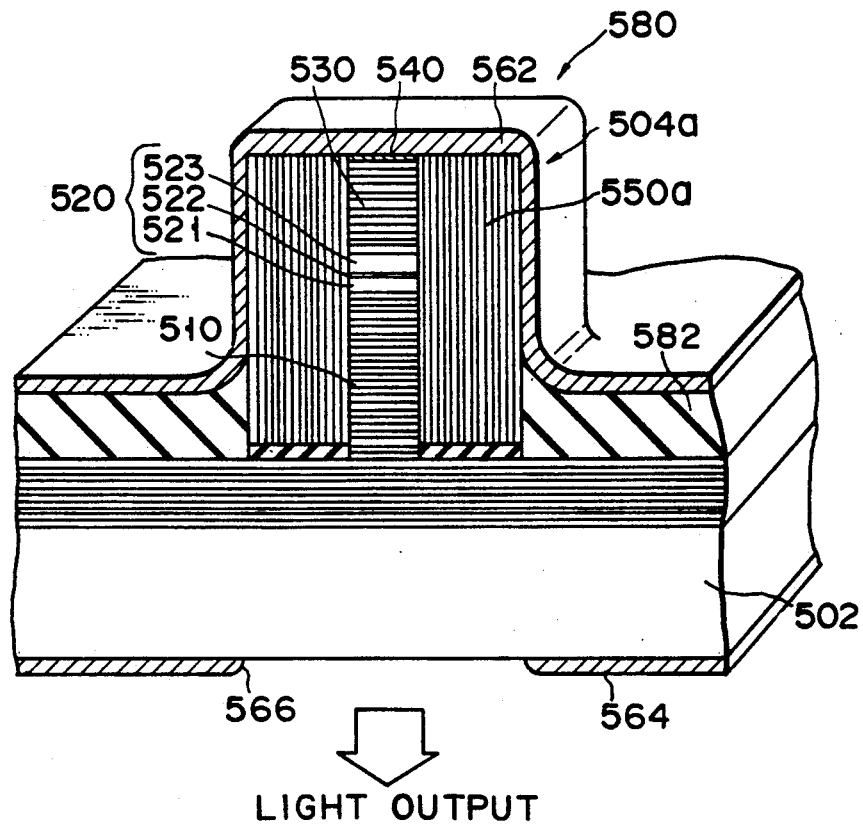

The laser 580 shown in FIG. 28 is similar to that of FIG. 27 except the following features. A laminated AlGaAs films constituting the third Bragg-reflector 550a are doped with an impurity such as Fe, thereby attaining high-resistance characteristic. Cylinder section 504 is shaped rectangularly rather than circularly. An additional insulative layer 582 is arranged around section 550a on the lower half portion of first Bragg reflector 510; it serves to achieve better current-leakage preventing performance in laser 580. Layer 582 is made from polyamide resin.

Figure 29:
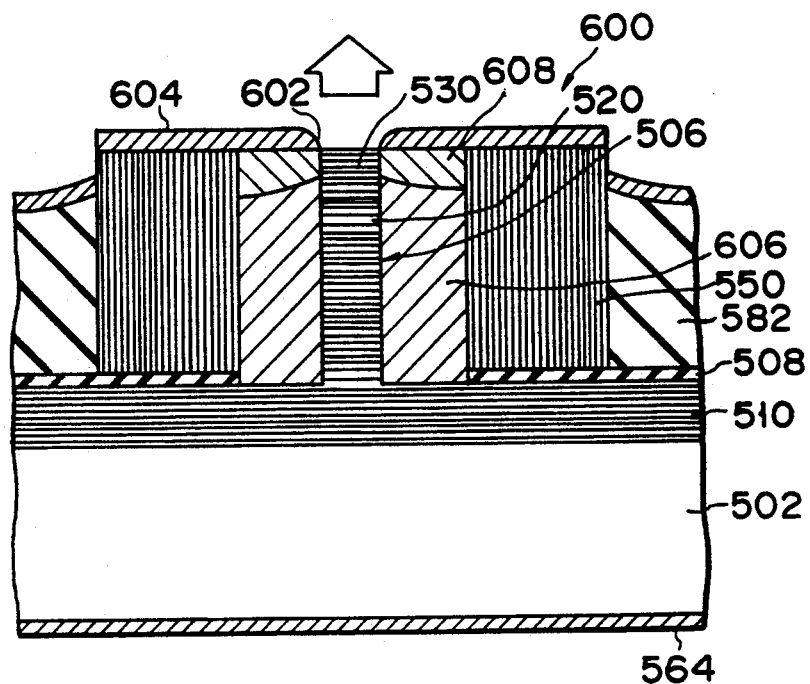

Another laser structure 600 shown in FIG. 29 is arranged such that an output light is sent forth upward from an opening 602, which is formed in an upper electrode 604. More specifically, multi-layered shank section 506 is surrounded by a high-resistance layer 606 and a conductive layer 608 around the side wall thereof. Layer 606 is in contact with first Bragg reflector 510, DHS section 520, the lower portion of second Bragg reflector 530, and third Bragg reflector 550, each of which is similar to that shown in FIG. 27. Layer 608 is stacked on layer 606 to be in contact with the upper portions of second reflector 530. Layer 606 is made from either non-doped $Al_sGa_{1-s}As$ ($0 < s < 1$) or semi-insulating material, whereas layer 608 is from p-type $Al_tGa_{1-t}As$ ($0 < t < 1$). The top surface of shank section 506 is exposed through opening 602. Electrode layer 564 on the rear substrate surface has no opening.

Figure 30:
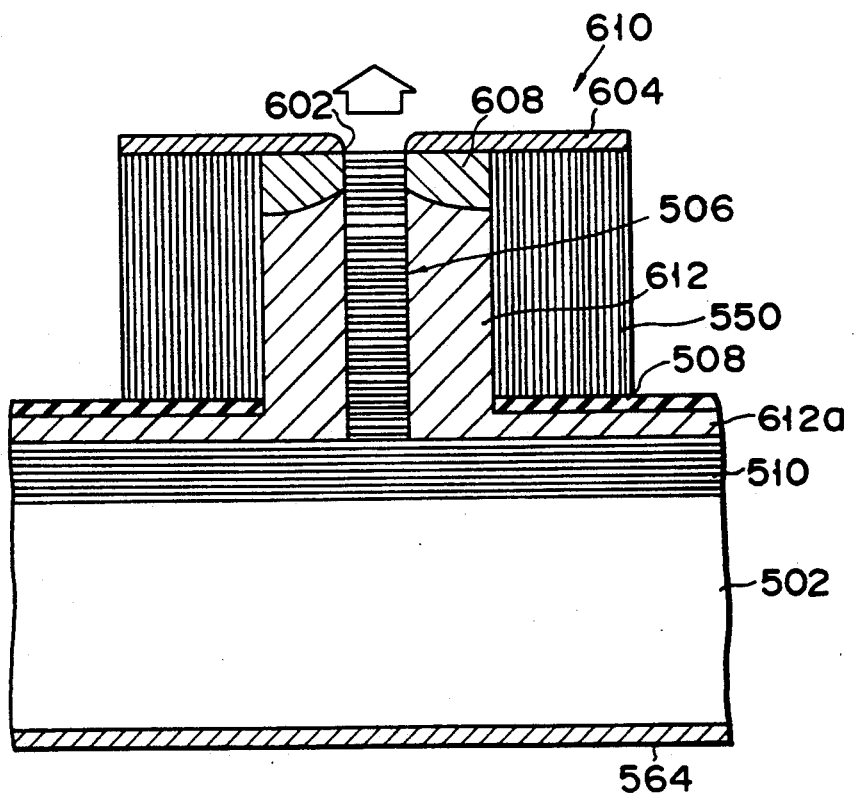

A laser 610 of FIG. 30 is similar to that shown in FIG. 29 with layer 606 (FIG. 29) being replaced by a non-doped $Al_sGa_{1-s}As$ ($0 < s < 1$) layer 612, which has a thin base layer portion 612a stacked on the lower part of first Bragg reflector 510 to define an "L"-shaped cross-section. Layer portion 612a horizontally expands to lie between the bottom of third reflector 550 and the lower part of first reflector 510.

The stacked layers 606, 608 around shank section 506 may be formed using a known fabrication technique, such as LPE, MBE, or MOCVD method. More specifically, after shank section 506 is formed using a similar process to that shown in FIGS. 22A, 22B, non-doped $Al_sGa_{1-s}As$ layer 606 and p-type $Al_tGa_{1-t}As$ ($0 < t < 1$) layer 608 are sequentially formed so that section 506 is burred in these layers with its top surface being exposed. A silicon oxide layer is then deposited on the resultant structure. A known photo-lithography or electron-beam lithography is employed to etch the silicon-oxide layer, thereby obtaining a mask layer defining the width of stacked layers 606, 608 shown in FIG. 29. A dry etching is then performed to etch the resultant structure, obtaining the etched layers 606, 608. The manufacturing processes that follow will be similar to those shown in FIGS. 22C through 22F. Note that the L-shaped profile of high-resistance layer 612 shown in FIG. 30 may be easily fabricated by causing the etching process therefor using the mask layer to be terminated while layer portion 612a is kept unetched. Third Bragg reflector 550 may be formed by employing the manufacturing steps shown in FIGS. 22C to 22E.

The present invention is not limited to the above-described specific embodiments and may be practiced or embodied in still other ways without departing from the spirit or essential character thereof. For example, while the n-type substrate is used in the above presented embodiments, a p-type substrate may be employed instead. In that case, the conductivity types of the remaining sections in each embodiment should be reversed in a known manner. The GaAlAs-based materials employed in the above embodiments may be replaced by one of similar semiconductor materials, such as InGaAlAs, InAlGaP, InGaAsP, or the like.

What is claimed is:

1. A semiconductor laser device comprising:
a semiconductive substrate having a surface;
a first distributed reflector section having two kinds of semiconductor layers which are different in refractive index from each other and are alternately laminated;
a double-heterostructure section including a first or lower semiconductive cladding layer and a second or upper cladding semiconductive layer separated by an intermediate active layer;
a second distributed reflector section on said double-heterostructure section with two kinds of semiconductor layers which are different in refractive index from each other and are alternately laminated;
said first reflector section, said double-heterostructure section, and said second reflector section having a projected structure with a side wall; and
a third distributed reflector section surrounding said side wall of said projected structure on said substrate and including two kinds of semiconductor layers which are different in refractive index from each other and are alternately laminated along a certain direction parallel with the surface of said substrate.

2. A laser according to claim 1, further comprising:
insulator means for increasing electrical insulation between said first reflector section and said third reflector section.

3. A laser according to claim 2, wherein, said, second and third reflector sections define therebetween an interface region which is doped with an impurity.

4. A laser according to claim 3, further comprising:
a conductive layer which at least partially covers said projected structure and said third reflector section.

5. A laser according to claim 4, wherein said second and third reflector sections include a proton-implanted region.

* * * * *